US008933473B1

(12) United States Patent
Dubin

(10) Patent No.: US 8,933,473 B1
(45) Date of Patent: Jan. 13, 2015

(54) METHOD, APPARATUS AND SYSTEM FOR PROVIDING LIGHT SOURCE STRUCTURES ON A FLEXIBLE SUBSTRATE

(76) Inventor: Valery Dubin, Portland, OR (US)

( * ) Notice: Subject to any disclaimer, the term of this patent is extended or adjusted under 35 U.S.C. 154(b) by 60 days.

(21) Appl. No.: 13/487,088

(22) Filed: Jun. 1, 2012

(51) Int. Cl.
  *H01L 29/22* (2006.01)
(52) U.S. Cl.
  USPC .................................. 257/98; 257/79; 257/99
(58) Field of Classification Search
  USPC .............................................. 257/71, 98, 99
  See application file for complete search history.

(56) References Cited

U.S. PATENT DOCUMENTS

| | | | |
|---|---|---|---|
| 7,963,674 B2 * | 6/2011 | Takekuma et al. | 362/249.04 |
| 8,309,979 B2 * | 11/2012 | McKenzie et al. | 257/93 |
| 8,523,385 B2 * | 9/2013 | Lu et al. | 362/231 |
| 8,680,556 B2 * | 3/2014 | Ibbetson et al. | 257/98 |
| 2005/0051789 A1 * | 3/2005 | Negley et al. | 257/99 |
| 2005/0174473 A1 * | 8/2005 | Morgan et al. | 348/370 |
| 2007/0007540 A1 * | 1/2007 | Hashimoto et al. | 257/94 |
| 2009/0103005 A1 * | 4/2009 | Nakazato et al. | 349/62 |
| 2011/0193484 A1 * | 8/2011 | Harbers et al. | 315/129 |
| 2012/0068615 A1 * | 3/2012 | Duong et al. | 315/192 |
| 2012/0211793 A1 * | 8/2012 | Bergmann et al. | 257/99 |
| 2012/0261689 A1 * | 10/2012 | Appelt et al. | 257/98 |
| 2012/0280263 A1 * | 11/2012 | Ibbetson et al. | 257/98 |

* cited by examiner

*Primary Examiner* — Thanh V Pham
(74) *Attorney, Agent, or Firm* — Blakely Sokoloff Taylor Zafman, LLP

(57) ABSTRACT

Light emitting diode (LED) package structures employing large area substrates are described. Panel or reel-to-reel substrate processing is utilized in the manufacture of such LED package structures. In some embodiments, electrochemically deposited metal patterns and through substrate vias (TSuVs) are formed through glass substrates and/or interposers. In some embodiments, the metal deposited into the TSuVs offer high thermal conductivity a low coefficient of thermal expansion (CTE) that is to closely match the CTE of the glass. Singulated LED package structures including a plurality of LEDs arrayed for displays, such as, but not limited to, liquid crystal displays (LCDs) and LED displays or for general purpose LED light sources are described, as are LED package structures including active devices (e.g., ICs) and/or passive devices (e.g., capacitors, inductors, resistors, etc.) integrated with LEDs at the package level.

30 Claims, 13 Drawing Sheets

US 8,933,473 B1

METHOD, APPARATUS AND SYSTEM FOR PROVIDING LIGHT SOURCE STRUCTURES ON A FLEXIBLE SUBSTRATE

TECHNICAL FIELD

Embodiments of the present invention generally pertain to light source structures employing light emitting diodes (LEDs) and more particularly pertain to LED packaging.

BACKGROUND

Currently standard LED packages offer limited integration and functionality of light source systems and do not extensively integrate passive and/or active components at the package level. One reason for this is that system cost increases considerably and devices integrated with the LEDs suffer from large thermal cross-talk that reduces device reliability. The high cost of integration is, in part, attributable to complicated package structure and reliance on relatively expensive package substrates.

FIG. 1 illustrates a conventional LED package structure as formed by a conventional packaging method 100. LEDs 105 are disposed on a silicon substrate 110. The silicon substrate is typically a wafer of the type employed in integrated circuit manufacture. As such, the substrate area is limited to the state of the art in IC manufacture, which is currently 300 mm diameter wafers. While 450 mm diameter wafers are in development, no further increases in silicon wafer size are expected in the coming decades due to prohibitively high tooling costs. With the area of the substrate 110 so limited, many substrates are required to manufacture high volumes the conventional LED package structure. Also, to fabricate a matrix or array of LED devices into a form factor that is larger than a conventional silicon wafer, such as for a large panel display screen, or high lux light source, wafer substrates must first be cut into squares or completely singulated and then re-assembled with like units into a large matrix.

As shown in FIG. 1, the packaging method 100 entails forming a cavity 115 in the silicon substrate (e.g., by a KOH etch) and depositing a metal film 120 in the cavity. Through substrate vias (TSuVs) 125 are then formed and the LED chips 105 are mounted with a chip to wafer (C2W) bonding process. A silicone encapsulant 130 fills in the cavity 115 and a lens wafer 135 is bonded with a wafer-to-wafer (W2W) bonding process. Singulation is then performed to arrive at packaged LED structures.

An LED package structure that enables larger form factors with reduced assembly, enables less costly package-level integration with active and/or passive components, offers improved thermal management, and all at a reduced cost is therefore of significant technical and commercial advantage.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
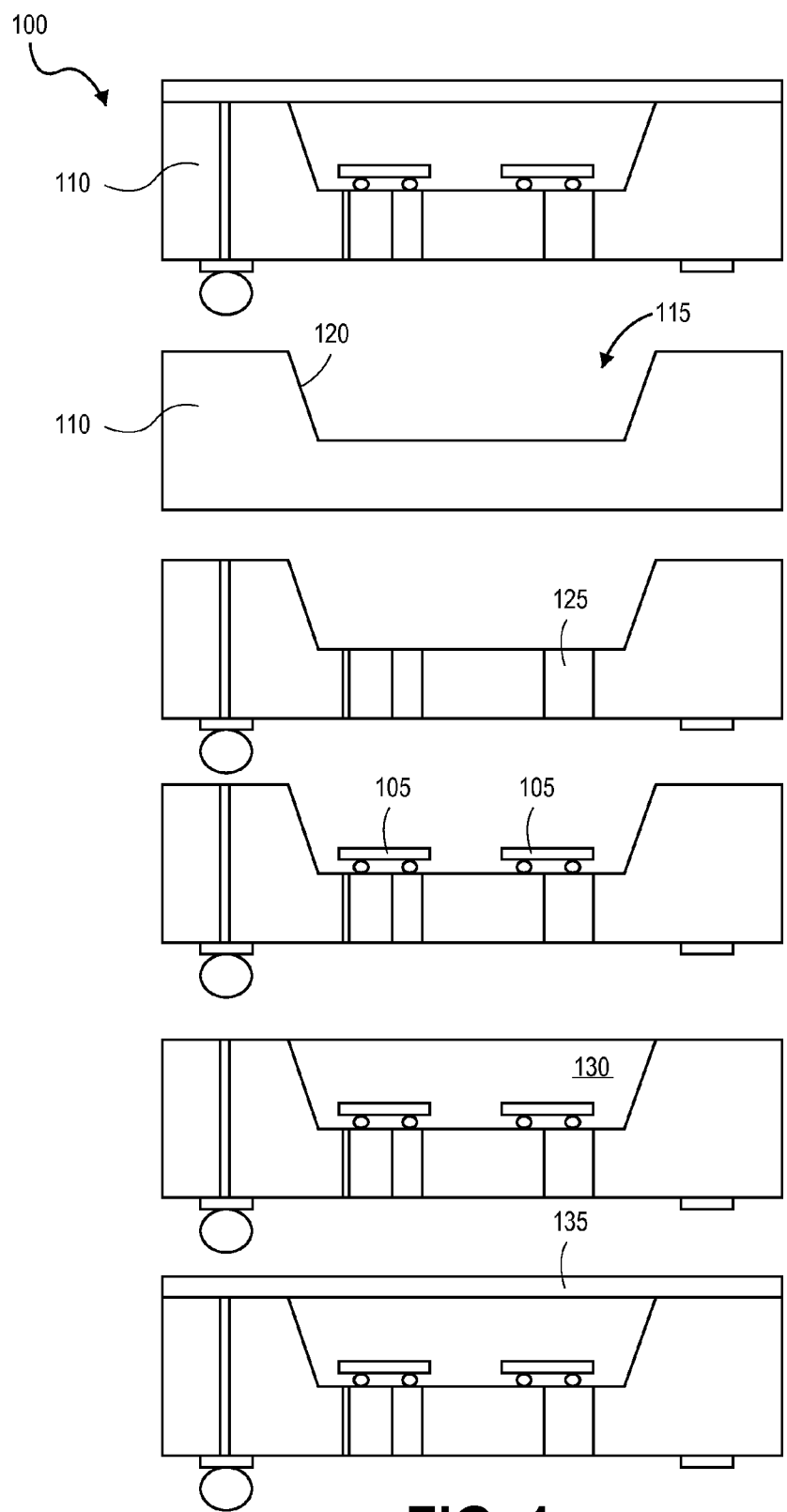
FIG. 1 illustrates a conventional LED package structure and fabrication method.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural and functional relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Light emitting diode (LED) package structures employing large area substrates are described. Exemplary large-area form factors include, but are not limited to, display panel substrates having an area on the order of 100 $ft^2$ (e.g., 10G or later panel technology), reel-to-reel substrates having lengths on the order of kilometers, and solar panel substrates having an area that is 2-10 times larger than those employed in integrated circuit (IC) device fabrication. In some embodiments, electrochemically deposited metal patterns and through substrate vias (TSuVs) are formed in glass substrates and/or interposers. In some embodiments, the metal deposited into the TSuVs offer high thermal conductivity a low coefficient of thermal expansion (CTE) that is to closely match the CTE of glass.

In embodiments, singulated LED package structures include a plurality of LEDs arrayed for displays, such as, but not limited to, liquid crystal displays (LCDs) and LED displays or for general purpose LED light sources (i.e., bulbs). LED package structures including active devices (e.g., ICs) and/or passive devices (e.g., capacitors, inductors, resistors, etc.) integrated with LEDs at the package level are also described. For certain such embodiments, integration conventionally relegated to a printed circuit board (PCB) is performed directly on the substrate upon which the LED is mounted, thereby eliminating any need for a PCB. In embodiments, LED package structures include one or more ICs for networking the packaged LED with external devices, such as smart phones, computers, television displays, etc., for example to support a direct addressing of the integrated LED package.

Equipment and techniques for fabricating LED package structures are also described. In embodiments, operational sequences, some of which include, selective photo-electrochemical and chemical metal deposition techniques, are described for large panel and/or reel-to-reel (R2R) formats.

Generally, the embodiments described herein may employ any LED device technology. Many LED device structures are known, and embodiments of the present invention are not limited with respect to such LED device structures. For example, any inorganic semiconductor-based LED technologies known in the art, such as, but not limited to, group IV (e.g., Si) devices and group III-nitride (e.g., GaN) devices may be employed in the practice of the embodiments described herein.

Figure 2A:
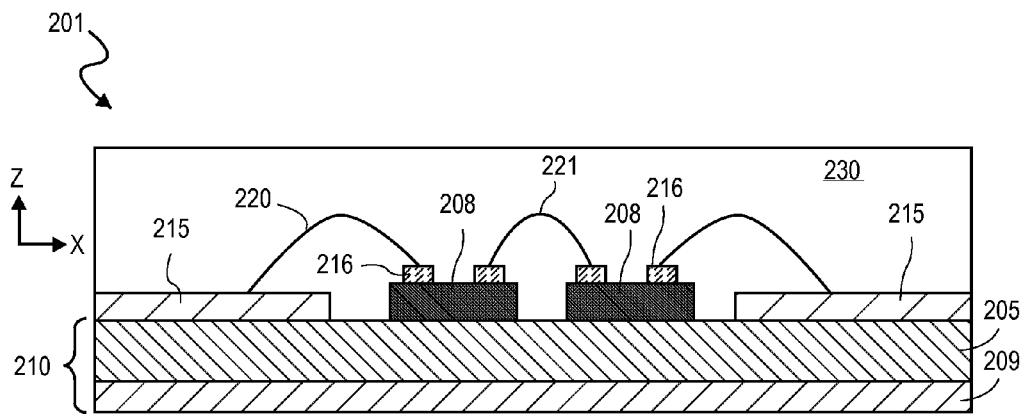
FIGS. 2A, 2B, 2C and 2D each illustrate a cross-sectional view of an LED package structure, in accordance with an embodiment of the present invention.
Figure 2B:
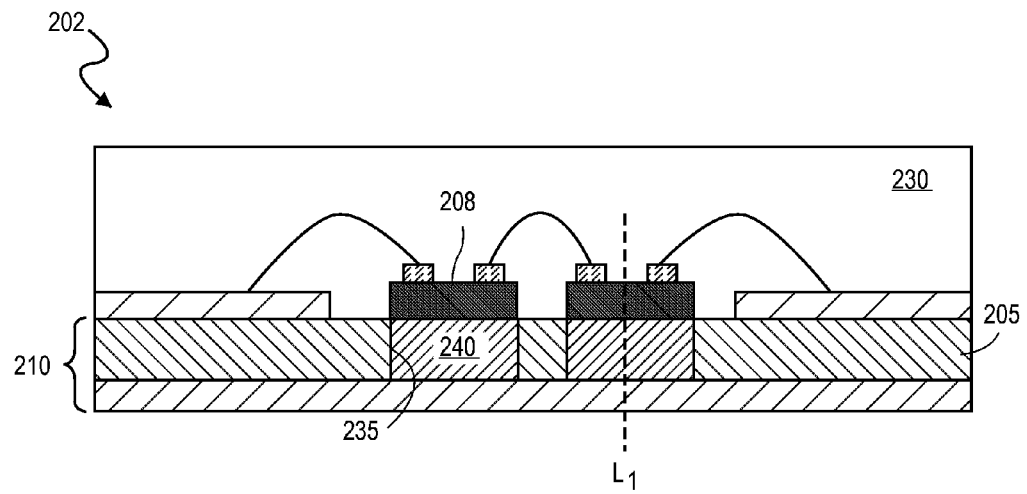
Figure 2C:
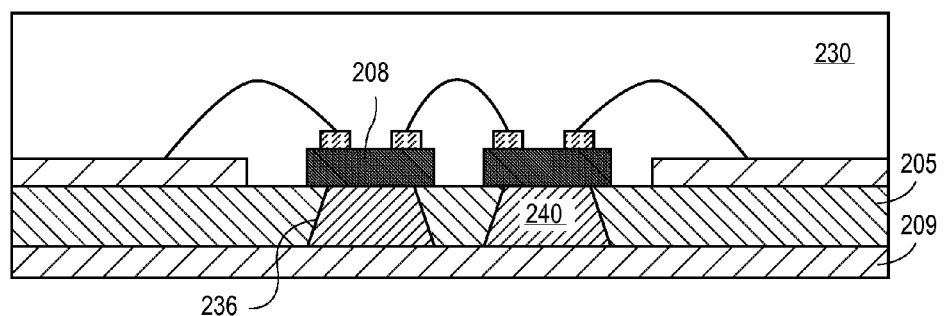

FIGS. 2A, 2B, and 2C each illustrate a cross-sectional view of an LED package structure, in accordance with embodiments of the present invention. FIGS. 3A, 3B, 3C, 3D, 3E, and 3F each also illustrate a cross-sectional view of an LED package structure, in accordance with embodiments of the present invention. Generally, these illustrated embodiments exemplify how a large area substrate, such as a panel or reel-rolled material may be utilized in an LED package structure to reduce the cost of the LED package or a system incorporating such a package. As used herein, a "large" area substrate is one which is at least twice the area of a substrate employed in traditional IC fabrication and may be as much as an order of magnitude, or more, larger. With current IC fabrication being on 300 mm diameter substrates with 450 mm diameter substrates in development, the surface area of an IC substrate is no more than 1600 $cm^2$. Embodiments described herein are applicable to substrates having a surface area of at least 3500 $cm^2$ and preferably on the order of square meters for panel embodiments (e.g., a 10G LCD panel is about 3.0 m on a side), and many tens of square meters for reel-rolled embodiments (e.g., which may be one the order of a meter wide and kilometers long).

In one embodiment illustrated by FIG. 2A, an LED package 201 includes an LED device 208 affixed to a first side of an optically transparent dielectric material 205. The LED device 208 may be affixed by any surface mount or flip-chip bonding material. In specific embodiments a low CTE metal material is utilized as the bonding material, such as, but not limited to, solder (e.g., SnAg, InAu) with any of: nickel-tungsten alloy (NiW), or a nickel-molybdenum alloy (NiMo), a cobalt-tungsten alloy (CoW), or cobalt-molybdenum alloy (CoMo), titanium tungsten (TiW), tungsten (W) or Covar. The LED device 208 may be affixed to a planar surface of the dielectric material 205 where the thickness of the dielectric material 205 is minimized (e.g., less than 200 µm) or within a recess or cavity (e.g., similar to the recess 130 illustrated in FIG. 1) formed in the dielectric material 205. As described further herein, such cavities can be provided as part of a through substrate via, for example, where the dielectric material 205 has a thickness of at least 250 µm. The transparent dielectric material 205 is transparent to at least one wavelength of light emitted by the LED device 208 and may be transparent to all emitted wavelengths. Also disposed on the first side of the dielectric material 205 is a pair of metal pads or LED device interconnects 215 that are electrically coupled to individual LED device terminals 216. In the exemplary embodiment illustrated by FIG. 2A, the LED device terminals 216 are disposed on a side of the LED device opposite that which is affixed to the dielectric material 205, and so are electrically coupled by bond wires 220 in a surface mount implementation. However, in alternate embodiments where the LED device terminals 216 are disposed on the side of the LED device that is affixed to the dielectric material 205, as in a flip-chip implementation (not depicted), the device terminals 216 are directly bonded to metal pads that are the functional equivalent of the LED device interconnects 215. Disposed over the first side of the dielectric material 205 is an optically transparent cap 230 encapsulating the LED device 208. Opposite the LED device 208, a metal film 209 is disposed on a second side of the dielectric material 205. The metal film 209 is to be reflective (i.e., a mirror) of at least one wavelength of light emitted by the LED device 208 and may be reflective of all wavelengths emitted by the LED device 208.

For the LED package 201, the transparent dielectric material 205 serves as the substrate, and further may provide at least one of electrical and thermal isolation between adjacent LED devices 208. In embodiments, the dielectric material 205 is a silica-based glass, such as substantially pure silica ($SiO_2$), non-alkali glass (of the types employed in liquid crystal display manufacture), or soda-lime glass (e.g., of the types employed in window manufacture and the bottling industry). In other embodiments, the dielectric material 205 is a polymer-based glass, such as an acrylic. In certain embodiments, the dielectric material 205 is a (p-xylylene)-based polymer, such as Parylene X, or aluminum oxide ($Al_2O_3$).

In embodiments, the transparent dielectric material 205 is a large area substrate (i.e., having a surface area of at least 3500 $cm^2$, and preferably of 80-100 $ft^2$ where the transparent dielectric material 205 is panalized, and up to many tens of square meters where the transparent dielectric material 205 is rolled). As such, FIG. 2A illustrates a single LED package 201 which is a repeating unit arrayed over the surface the large area substrate. Depending on the embodiment, the transparent dielectric material 205 has a thickness (i.e., z-dimension in FIG. 2A) between 0.1 µm and 1000 µm. Within more or less of this thickness range, depending on properties of the dielectric material 205, the material will be flexible, or of low stiffness. For example, in one exemplary embodiment where the material 205 is a non-alkali glass having a thickness of about 150 µm or less, the dielectric material 205 is flexible enough to be wound to/from a reel or spool.

In embodiments, the metal film 209 is a film continuously covering the surface area on a second side of the dielectric material 205 that is at least as large as the area over which LED device(s) 208 are disposed. Such a foil may further span an entire surface of the dielectric material 205 forming a laminate substrate 210 upon which a plurality of adjacent LED packages 201 are formed and then singulated. As the primary function of the metal film 209 is as an optical minor increasing LED device light output, the metal film 209 need not provide significant mechanical support to the package although it may optionally supplement the mechanical stiffness of the dielectric material significantly. As such, the metal film 209 thickness may vary over a wide range. In embodiments where the metal film 209 is not providing significant mechanical support to the pack 201, the metal film 209 has a thickness less than 25% of the thickness of the dielectric material 205. In specific embodiments where the dielectric material thickness is between 0.1 μm and 1000 μm, the metal film 209 has a thickness of between 0.01 μm and 100 μm. The metal film 209 may generally be any foil with specific metal film embodiments including any of: aluminum (Al), aluminum-copper alloy (AlCu), silver (Ag), silver-tungsten alloy (AgW), gold (Au), copper (Cu), chromium (Cr), a copper-silver (Cu—Ag) bi-layer stack, or nickel-copper-silver (Ni—Cu—Ag) tri-layer stack. One or more adhesion layers may further be disposed between the metal film 209 and the dielectric material 205, such as, but not limited to $TiO_2$. In further embodiments, silicon may be alloyed with the metal to provide a smaller CTE. For example, the metal film 209 may be an aluminum-silicon alloy (AlSi) or aluminum-silicon-copper alloy (AlSiCu).

The metal interconnects or pads 215 may be of a same or different composition as that of the metal film 209. In advantageous embodiments, the pads/interconnects 215 have the same composition as the metal film 209, enabling both to be formed concurrently by a single process, such as plating. Exemplary pad compositions include at least one of aluminum (Al), silver (Ag), gold (Au), nickel (Ni), copper (Cu), silver-tungsten alloy (AgW), or copper-palladium alloy (CuPd). The pads 215 may also comprise a stack laminated metal stack, such as a bi-layer of nickel-silver (Ni—Ag), nickel-gold (Ni—Au), nickel-copper (Ni—Cu), copper-silver (Cu—Ag), or a tri-layer of nickel-copper-tin (Ni—Cu—Sn) or nickel-copper-silver (Ni—Cu—Al). Just as for the metal film 209, silicon may be added (e.g., AlSi) for reduced CTE (e.g., to match that of the metal film 209). In further embodiments, copper (Cu) is added for improved electromigration resistance (AlSiCu).

The cap 230 may generally be any material optically transparent to at least one wavelength of light emitted by the LED device 208. Any plastics, epoxy resins, acrylics, silicones, and like materials known in the art to be applicable for LED lenses may be utilized for the cap 230 and embodiments of the present invention are not limited in respect to the composition of the cap 230. Additionally, the cap 230 may also be doped with any pigments and/or emission modifiers (e.g., phosphorus, quantum dots) known in the art for LED device encapsulants. The cap 230 may have a planarized top surface, as shown in FIG. 2A, or have a lens topology (spherical, Fresnel, etc). For planar embodiments where the dielectric material 205 is in the form of a large area panel, the cap 230 may also be a panel (i.e., a second glass panel) disposed over the LED device with a conformally deposited transparent parylene sealing the LED device below the planar cap. Alternatively, the cap 230 may be a wet-deposited material (e.g., spray on polymer). In embodiments, a maximum thickness of the cap 230 within each package 201 is at least as thick as the dielectric 205. For example, where the cap 230 is molded into a spherical lens, the thickness of the cap 230 at the lens axis is at least equal to that of the dielectric 205. In embodiments, the cap 230 is continuous between adjacent packages 201, reaching a minimum thickness that either significantly increases the stiffness of the dielectric 205, or not. For example in one embodiment the minimum thickness of cap 230 is 50% or more of the thickness of the dielectric 205) so that the total thickness of the package 201 in the z-dimension is sufficient to preclude rolling onto a spool for R2R processing such that a roll-to-singulation process is performed whereby a rolled substrate (e.g., the dielectric material 205) is unrolled, the metal film 209 and pads 215 formed, the LED devices 208 mounted and interconnected, the cap 230 deposited and package 201 singulated off the large area substrate. Alternatively, where the minimum thickness of cap 230 is sufficiently small (e.g., less than 25% of the thickness of the dielectric 205), the total thickness of the package 201 in the z-dimension is sufficiently low to permit rolling packages 201 back onto a spool for R2R processing.

In embodiments, the LED package 201 includes a plurality of LED devices 208 coupled to a pair of metal pads 215, as shown in FIG. 2A. For example, many LED devices 208 may be interconnected in series, parallel, or made separately addressable through electrical circuit configurations accessible via the metal pads/interconnects 215. In one embodiment, power to each of the first plurality of LED devices 208 is routed through two of the metal pads/interconnects 215 which are in turn to be coupled to rails of a voltage supply, for example for a series configured multi-LED illumination source. In embodiments where LED devices 208 of a packaged device are separately addressable, a separate metal pad 215 may be provided for each LED device 208, or a unique combination of metal pads 215 may be provided for each LED device 208 (e.g., a row pad and column pad for each LED device 208). Bond wires 221 may be utilized to interconnect the first plurality of LED devices 208, or electrically equivalent routing may be implemented with the same metallization used for the metal pads 215, for example in a flip-chip implementation.

In embodiments, an LED package structure includes one or more through substrate vias (TSuVs). As shown in FIG. 2B, the LED package 202 includes a TSuV 235 disposed proximate to the LED device 208. In the exemplary embodiment, the TSuV 235 has a longitudinal axis $L_1$ aligned with a center of the LED. In alternative embodiments where a single TSuV 235 is provided for a plurality of LEDs (e.g., a particular RGB or RGBW cluster) TSuV 235 has a longitudinal axis $L_1$ aligned with a center of the plurality. The TSuV is to function at least as a thermal via, improving thermal conduction between the LED device 208 and the second side of the dielectric 205. In the exemplary embodiment, the TSuV 235 extends between the LED device 208 and the metal film 209.

Generally the TSuV 235 may comprise a cavity formed from either or both sides of the dielectric material 205. The TSuV 235 may be formed before or after the LED device 208 is mounted. In an embodiment, a blind via landing on the metal film 209 has a straight wall (FIG. 2B) or a tapered wall as etched (e.g., anisotropic plasma) or drilled (laser or mechanical) from the LED-device side (i.e., front side). Alternatively, the TSuV 236 may have tapered walls with a neck in the center of the dielectric material 205 formed by simultaneous wet etching from both sides of dielectric material 205. Another alternative is shown in FIG. 2C, where an LED package 203 includes a TSuV 236 entailing a blind via landing on the LED device 208. For such an embodiment, the blind via may again have a straight wall or tapered wall (FIG. 2C) as etched or drilled (laser or mechanical) from the back side of the substrate prior to formation of the metal film 209, or tapers indicative of simultaneous wet etching from two opposite sides.

The TSuV 235 is filled with a via metal 240 having good thermal conductivity and a CTE that is sufficiently well matched that thermal stress-related film delamination is avoided when the LED package 202 is operational. The via metal is also preferably platable as plating offers considerable cost savings over alternative via fill techniques, such as physical vapor deposition (PVD). In one advantageous embodiment, both the metal film 209 and the via metal 240 have a same composition and are plated concurrently with the metal film 209 being a non-sacrificial plating overburden of the via fill. In another embodiment, both the metal pad 215 and the via metal 240 have a same composition and are plated concurrently. While the choice of via metal being dependent on the choice of dielectric material 205 from a standpoint of CTE matching, exemplary materials for via metal 240 include, but are not limited to, copper (Cu), nickel (Ni), cobalt (Co), tungsten (W), molybdenum (Mo), aluminum (Al), and their alloys. Noting that copper has a relatively high CTE and so is not ideally compatible with a number of the dielectrics that may be used for the dielectric material 205, in preferred embodiments the via metal 240 is an alloy of tungsten or molybdenum which each have a relatively low CTE. Alloys thereof permit tuning of the CTE as a function of alloy composition. In certain such embodiments, the via metal 240 is a nickel-tungsten alloy (NiW), a nickel-molybdenum alloy (NiMo), a cobalt-tungsten (CoW), or cobalt-molybdenum (CoMo).

Figure 2D:
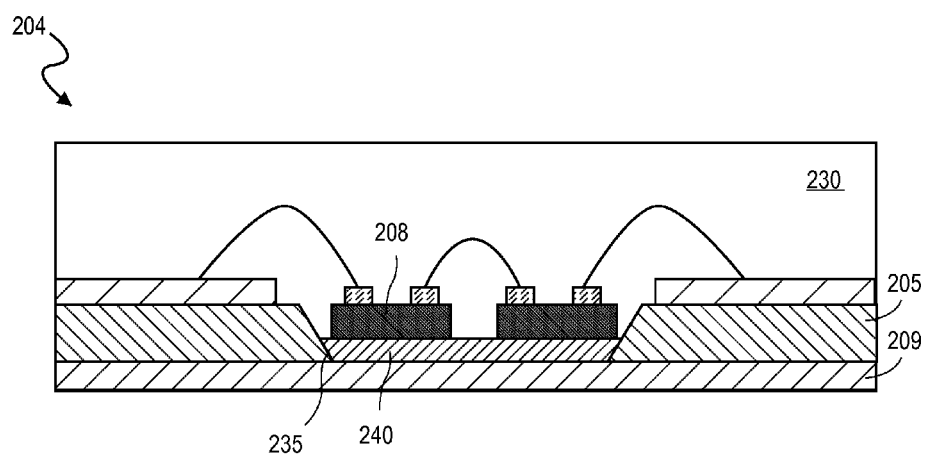

In certain embodiments, the LED device 208 is disposed in a cavity or recess below a top surface of the dielectric material 205. In one such embodiment illustrated by FIG. 2D, a TSuV 235 having a center aligned with a center of a plurality of LED devices 208 is partially filled with via metal 240, for example by an electrolytic plating process employing the metal film 209 as a plating electrode or with a selective electroless process employing the metal film 209 as a catalytic surface. The partially filled TSuV 235 then forms a recess into which the LED device(s) 208 is disposed with the LED device(s) 208 affixed to the via metal 240.

In embodiments, an LED package includes an interposer. FIGS. 3A, 3B, 3C, 3D, 3E, and 3F each illustrate a cross-sectional view of an LED package structure, in accordance with an embodiment of the present invention that includes an interposer. Generally, any of the package structures illustrated in FIGS. 2A-2C may be utilized in a package structure further incorporating an interposer. The interposer may function as a means of mechanical support for a packaged structure, in which case the interposer is provided as the large area substrate allowing the transparent dielectric layer to be very thin (e.g., 0.1 μm or less). With addition of the interposer, the transparent dielectric 205 need not itself be in the form of a large area substrate, but instead merely applied to the interposer as a thin film (e.g., liquid deposited dielectric) built-up to form another laminated substrate 210. The interposer may further function to integrate an LED device with other passive (e.g., capacitors, inductors, resistors, etc.) or active devices (e.g., ICs).

Figure 3A:
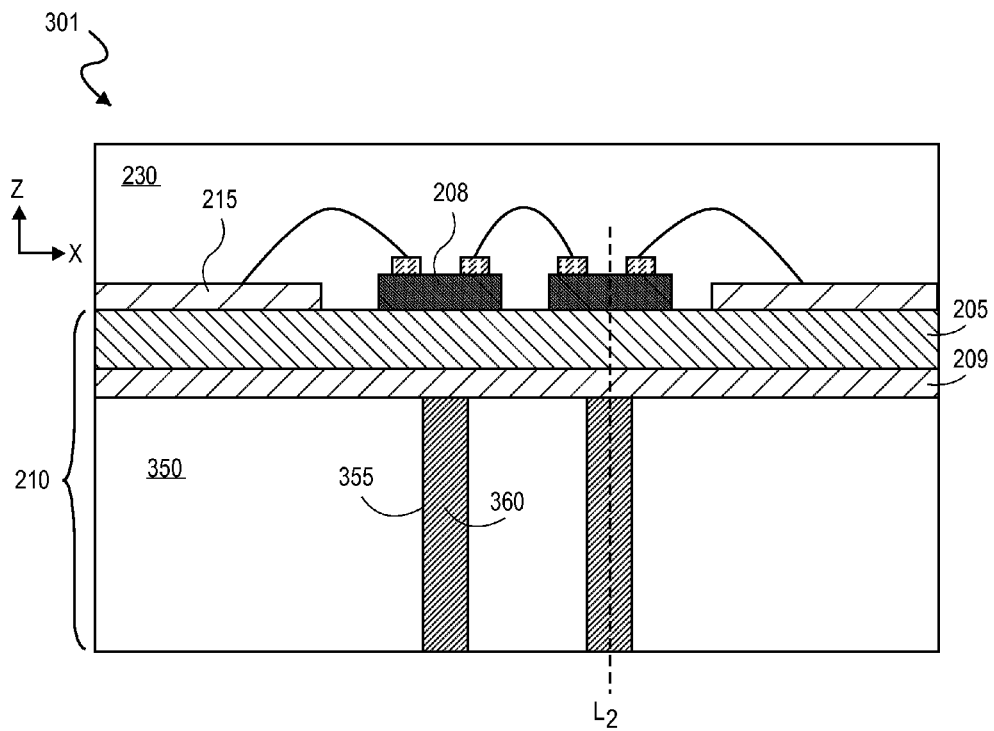
FIGS. 3A, 3B, 3C, 3D, 3E, and 3F each illustrate a cross-sectional view of an LED package structure, in accordance with an embodiment of the present invention.

As shown in FIG. 3A, an LED package 301 includes all the elements previously described in the context of FIGS. 2A-2C with like reference numbers for like elements. Additionally, the LED package 301 includes the interposer 350 disposed below, and in this particular embodiment, in contact with the metal film 209. Generally, the interposer 350 may be any of the materials described for the dielectric material 205, such as, but not limited to, non-alkali glass, soda lime glass, parylene (i.e. a (p-xylylene)-based polymer, such as Parylene X), and aluminum-oxide ($Al_2O_3$). For example, where the interposer 350 is a non-alkali glass the interposer 350 is a large area substrate such as a panel (e.g., 10G or later LDC panel glass) or reel-wound substrate in the same manner as was described for the transparent dielectric 205 in the context of LED packages 201, 202, and 203. In other embodiments, the interposer 350 is of amorphous silicon, polycrystalline silicon. In still other embodiments the interposer 350 is a ceramic, such as aluminum nitride (AlN), or boronitride (BN). All of these materials are also amenable to large substrate areas. For example, large silicon panels (amorphous or polycrystalline) of the type found in the solar panel industry may be employed as the interposer 350. Depending on the material, the interposer 350 may have a range of thickness between 100 μm and 600 μm with those below about 150-200 μm sufficiently pliable to be wound on a reel for a reel-based packaging process.

In embodiments, an LED package interposer includes an interposer TSuVs that passes through the interposer thickness. The interposer TSuV has a longitudinal axis $L_2$ that is aligned with a center of the LED device 208 or with a center of a plurality of LED devices (e.g., a RBG cluster, etc.). As illustrated in FIG. 3A, the interposer TSuVs 355 are disposed under the high power LED devices 208 for thermal conduction while no interposer TSuVs are disposed under the metal pads 215 or low power devices that may be further mounted onto the same interposer, as further described elsewhere herein in reference to FIG. 3B. In the exemplary embodiment, the interposer TSuV 355 extends between the metal film 209 and a back side of the interposer 350. A least a portion of the interposer TSuV 355 is filled with a via metal 360. As illustrated in FIG. 3A, the interposer via metal 360 extends an entire z-dimension thickness of the interposer 350. The TSuV 355 may be formed as a blind via from a backside of the interposer landing on the metal film 209. The metal film 209 may then serve as either an electrode for electrolytic plating of the via metal 360 or as a catalytic surface for electroless plating of the via metal 360. In one advantageous embodiment, the via metal 360 and the metal pads 215 are of a same composition, enabling the via metal 360 and the metal pads 215 to be plated concurrently for implementations where the plating is performed after the dielectric material 205 is deposited on the interposer, for example through a wet dielectric deposition process (e.g., spin-on, spray-on glasses, etc.).

Generally, the via metal 360 may be any of the metals previously described for the via metal 240. As an example, the via metal 360 may be any of copper (Cu), nickel (Ni), cobalt (Co), tungsten (W), molybdenum (Mo), aluminum (Al), and their alloys. In preferred embodiments the via metal 360 is an alloy of tungsten or molybdenum which each have a relatively low CTE. Alloys thereof permit tuning of the CTE as a function of alloy composition. In certain such embodiments, the via metal 360 is a nickel-tungsten alloy (NiW), a nickel-molybdenum alloy (NiMo), a cobalt-tungsten (CoW), or cobalt-molybdenum (CoMo).

For LED package embodiments that include an interposer, the interposer may either be bonded to either one of the metal film 209 (where the metal film 209 is not first plated onto the interposer 350) or the dielectric material 205 (where the metal film 209 is first plated onto the interposer 350), or the both the metal film 209 and dielectric material 205 may be deposited onto the interposer. For the former, the dielectric material 205 may either serve as a substrate (e.g., large area) upon which the LED device 208 is mounted prior to bonding with the interposer 350 (e.g., forming the LED package 201, 202, or 203), or the dielectric material 205 may be affixed to the interposer 350 before the LED device 208 is affixed over the dielectric material 205. For the latter, the interposer serves as the only substrate (e.g., large area) over which LED device 208 is affixed subsequent to deposition of the dielectric material 205.

Figure 3B:
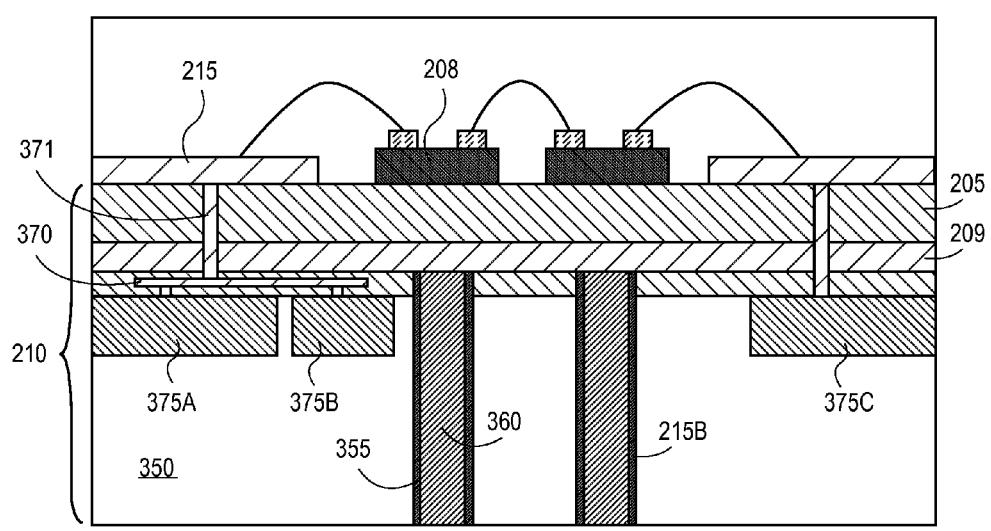

In an embodiment, an LED package structure includes at least one passive or active component disposed on the same interposer as an LED device. FIG. 3B illustrates an exemplary LED package 302 including all the features illustrated in FIG. 3A with the addition of an integrated circuit (IC) 375A disposed on the interposer 350. Thermal stress on the IC 375A is mitigated in the package structure embodiments described herein through application of through substrate vias and thermally isolation between the IC 375A LED device 208 provided by the low thermal conductivity dielectrics (e.g., glass) employed for the dielectric material 205 and/or interposer 350.

In the exemplary embodiment, the IC 375A is an IC chip bonded to a surface of the interposer 350 (e.g., in a recess). The 375A may be surface mounted to the interposer 350, for example flip-chip bonded to a redistribution layer 370 (e.g., that may be formed on a backside of the metal film 209 prior to bonding to the interposer 350). Generally, the IC 375A is to function in some capacity related to the LED device 208 and, as such, is electrically coupled to one or more of the metal pads/interconnects 215. As one example, the IC 375A is a driver or controller of the LED device 208 controlling one or more aspects of optical emission from the LED device, such as, but not limited to, emission wavelength (i.e., color) and output power. In another exemplary embodiment, the IC 375A is a power supply, such as, but not limited to, a buck-boost regulated current source, or the like. In another embodiment, the IC 375A contains memory, and/or logic, and/or sensing circuitry (e.g., ambient light detector, MEMS-based motion detector, etc.), and/or an RF transmitter and/or receiver (e.g., implementing a ZigBee® protocol stack for networking the LED device 208). As such, in embodiments the LED package 302 is a purpose-built package-level integrated LED device with the IC 375A rendering the LED device 208 independently addressable and remotely controllable. Such "smart" LED devices may be considered a package-level integrated display devices with any number of LED devices 208 controllable from a point outside of the package 302. As further shown in FIG. 3B, metal interconnects comprising a redistribution layer 370 are built-up on the interposer 350 using any conventional package build-up process (e.g., organic dielectrics) with a via 371 electrically coupled to an output pad of the IC 375A extending through the metal film 209 and dielectric material 205 to contact the metal pad 215. In embodiments, the via 371 includes a dielectric liner disposed over the inside sidewall of the via 371, separating and electrically isolating a fill metal, and/or metal diffusion barrier, and/or metals in a catalytic material employed to plate the fill metal from the metal film 209. Generally the dielectric liner 215B may be organic or inorganic, and, for example, may be one or more layers of at least one of: silicon dioxide ($SiO_2$), aluminum oxide ($Al_2O_3$), tantalum oxide ($Ta_2O_5$), silicon nitride ($Si_xN_y$), silicon carbide (SiC), silicon oxy-carbo-nitride (SiOCN), a benzocyclobutene (BCB)-based polymer, or a (p-xylylene)-based polymer, such as Parylene X.

In further embodiments, the LED device 208 is integrated with passive devices disposed on the interposer 350. In FIG. 3B, a thin film capacitor 375B is electrically coupled to the metal pad 215 through the redistribution interconnect 370 and via 371. The thin film capacitor 375B may have any conventional package-level capacitor structure, such as, but not limited to a metal-insulator-metal (MIM) stack, formed with any convention package-level technique, such as printing and/or metal plating. As further illustrated in FIG. 3B, an inductor 375C is also formed on the interposer 350 and is integrated with the LED device 208 through an electrical coupling (e.g., through the metal pad 215). One or more such package-level capacitors, inductors, and resistors may all be integrated with the LED device 208 with the interposer 350 to provide an integrated substrate 210 upon which the LED device 208 is to be mounted.

For embodiments where an LED package includes passive or active (IC) components, the interposer 350 may either be bonded to the redistribution layer 370 built-up over the dielectric material 205 and the metal film 209 (e.g., as would be formed on the LED packages 201, 202 and 203), bonded to the metal film 209 (where the metal film 209 and the dielectric material 205 is not first plated onto the interposer 350, but the redistribution layer 370 is formed on the interposer), or bonded to the dielectric material 205 (where the metal film 209 is plated over the redistribution layer 370). In such an embodiment, the dielectric material 205 may either serve as a substrate (e.g., large area) upon which the LED device 208 is mounted prior to bonding with the interposer 350 (e.g., forming the LED package 201, 202, or 203), or the dielectric material 205 may be affixed to the interposer 350 before the LED device 208 is affixed over the dielectric material 205. Alternatively, each of the redistribution layer 370, the metal film 209, and the dielectric material 205 may be deposited onto the interposer. For such an embodiment, the interposer serves as the only substrate (e.g., large area) over which LED device 208 is affixed subsequent to deposition of the dielectric material 205.

Figure 3C:
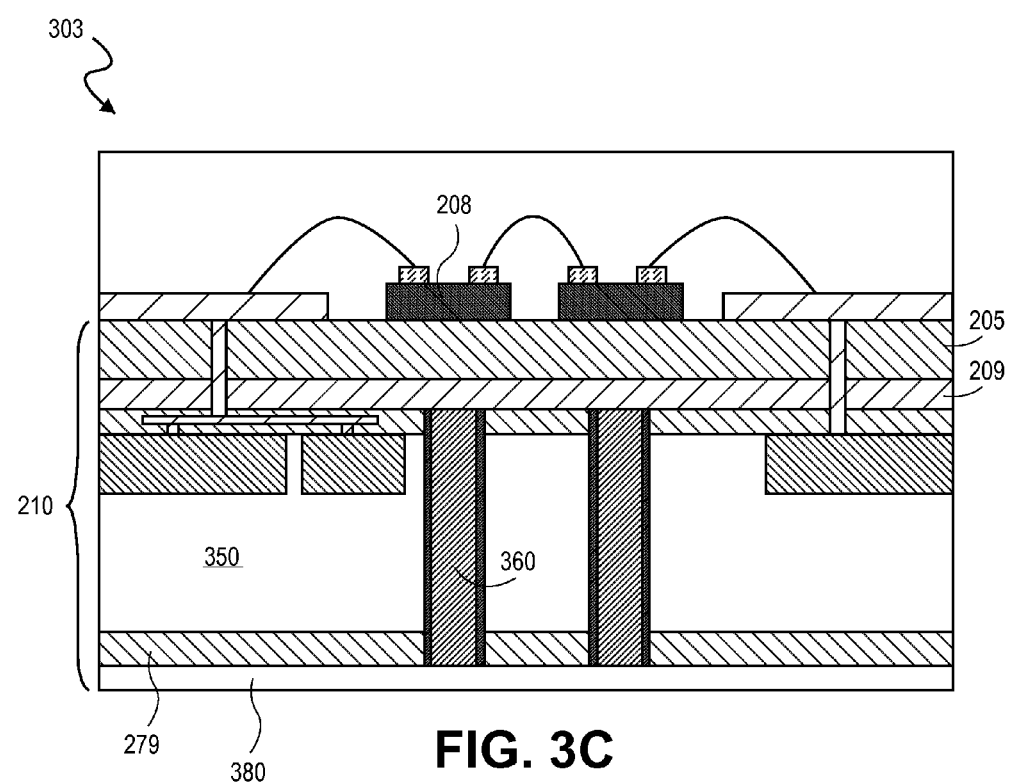

In an embodiment, an LED package includes a metallized interposer with a metal film disposed on a side of the interposer opposite an LED device. FIG. 3C illustrates an exemplary LED package 303 including all the features of the LED package 302 (FIG. 3B) with the addition of a back side metal 380 disposed on the interposer 350. In some embodiments, as illustrated in FIG. 3C, a thin film dielectric 379 may be disposed on the back side of the interposer 350, between the back side metal 380 and the interposer to improve adhesion of the back side metal 380 and/or provide electrical isolation, for example where the interposer 350 is polysilicon having relatively high electrical leakage properties. The back side metal 380 is to function as a heat spreader, heat sink, or as an interface to which a heat sink may be bonded or otherwise affixed. In one embodiment, the back side metal 380 is plated through a mask to form an integrated heat sink having greater external surface area than the surface area of the interposer occupied by the back side metal 380. Generally, the back side metal 380 may be any of the metals described elsewhere herein for the via metal 360. Preferred embodiments of the back side metal 380 include a nickel-tungsten alloy (NiW), or a nickel-molybdenum alloy (NiMo), a cobalt-tungsten alloy (CoW), or cobalt-molybdenum alloy (CoMo). In one embodiment, the via metal 360 and the back side metal 380 are of a same composition and may be deposited concurrently. In a further embodiment where the metal film 209 is formed on the interposer 350 rather than on the dielectric material 205, each of the metal film 209, via metal 360, and back side metal 380 are of a same composition and may be deposited onto the interposer concurrently.

Figure 3D:
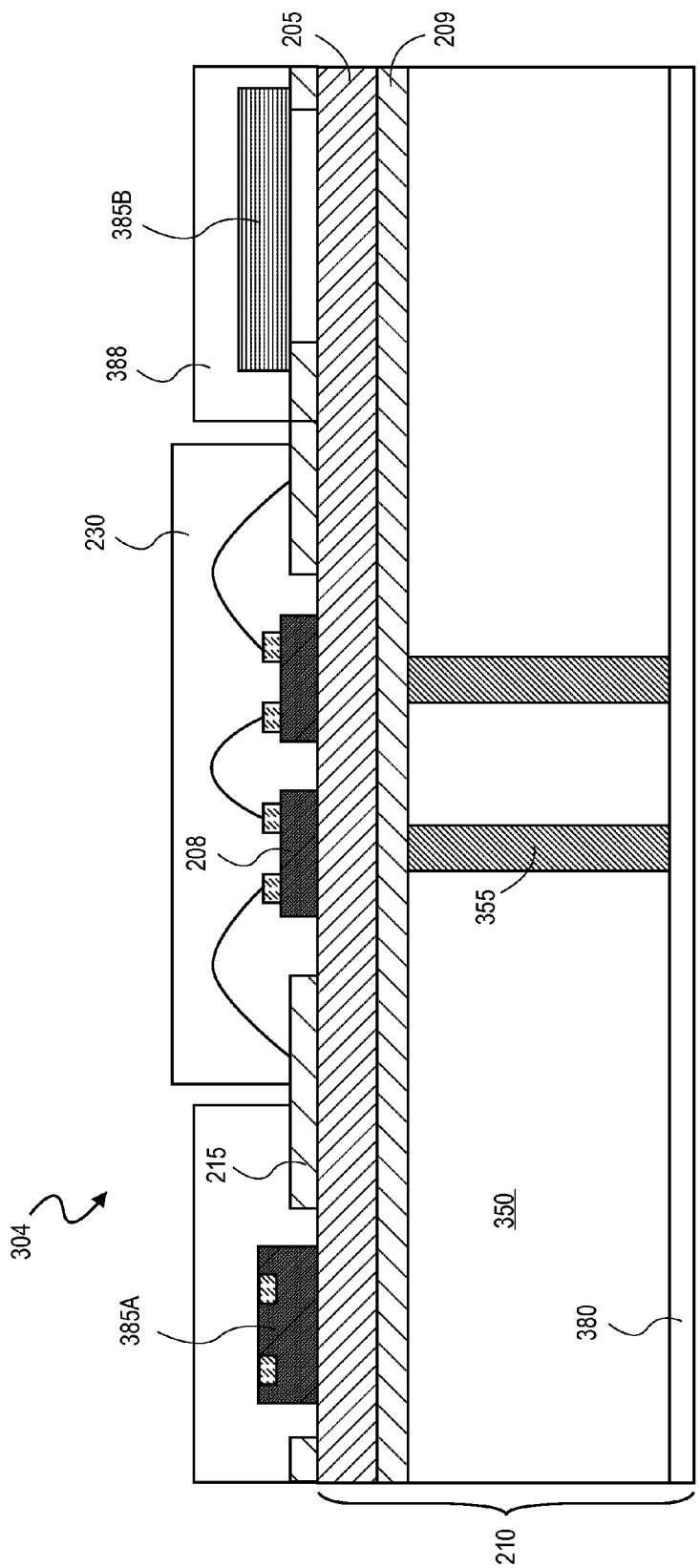

In an embodiment, an LED package includes a surface mounted component disposed on the same side of the dielectric material as the LED device. FIG. 3D illustrates an exemplary LED package 304 including all the features of the LED package 302 (FIG. 3B) with the addition of an integrated circuit (IC) 385A disposed on the dielectric material 205. The exemplary LED package 304 further illustrates a passive device 385B (e.g., capacitor, inductor, resistor) mounted to the dielectric material 205. The IC 385A and/or passive component 385B are electrically coupled to the LED device 208 with an output pad coupled to an electrode of the LED device 208 (e.g., out of the plane of FIG. 3D, so not depicted). For example, a wire bond may extend between the passive or active components and at least one metal pad 215. Alternatively, the IC 385A may be flip-chip bonded to have an output pad coupled to a metal pad coupled to an electrode of the LED device 208 (e.g., the metal pad 215 or another interconnected to the metal pad 215). The IC 385A may be any of the devices described in reference to the IC 375A, such as, but not limited to a LED device driver chip, memory chip, digital logic chip (ASIC or FPGA, etc.), analog sensor chip, RF transceiver chip, or a system-on-chip (SoC) including a functional combination of these ICs. As further shown in FIG. 3D, a molding compound 388 may be disposed over components mounted on the front side of the dielectric 205. The molding compound 388 may be any conventional in the packaging arts for the particular component or may be of the same transparent material employed for the cap 320 as a matter of fabrication convenience. The molding compound 388 may contain silica aerogel and xerogel to provide thermal isolation. In further embodiments, a first IC is disposed on the interposer 350, for example as shown in FIG. 3C, and a second IC is disposed on the dielectric 205, for example as shown in FIG. 3D.

The LED package structures described thus far herein may be incorporated into a wide variety of end user devices, such as, but not limited to, LED bulbs for general illumination (e.g., down lights, headlights, signal lamps, etc.), and special purpose displays. In the context of special purpose displays, the LED package structures may serve as a backlight system (e.g., for a liquid crystal display) or may form individual pixels of a display (e.g., in a large form LED display such as a billboard, etc.). One advantage of these package structures is that the same structure can be utilized in these separate applications with wide latitude for scaling the number of LED device per package-level unit with little or no retooling of the packaging line. For example, where one application requires only one LED device (e.g., a miniature indicator lamp), a first LED package with no integrated ICs or passive components is formed with a first plated metal pad pattern and with package singulation occurring at the single LED device level. A second LED package with a plurality of LED devices may then be formed with a different plated metal pad pattern and with package singulation generating larger units having more LED devices in each unit. A third LED package with a plurality of LED device and an integrated IC may then be formed with the addition of a second bonding module. For these various packages, a same R2R or panel-based packaging technique may be used.

Figure 3E:
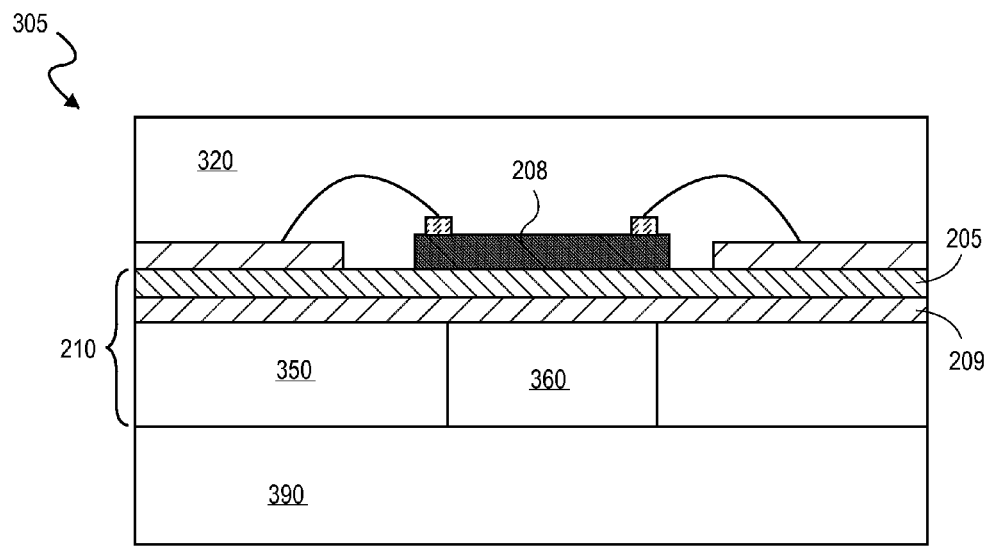
Figure 3F:
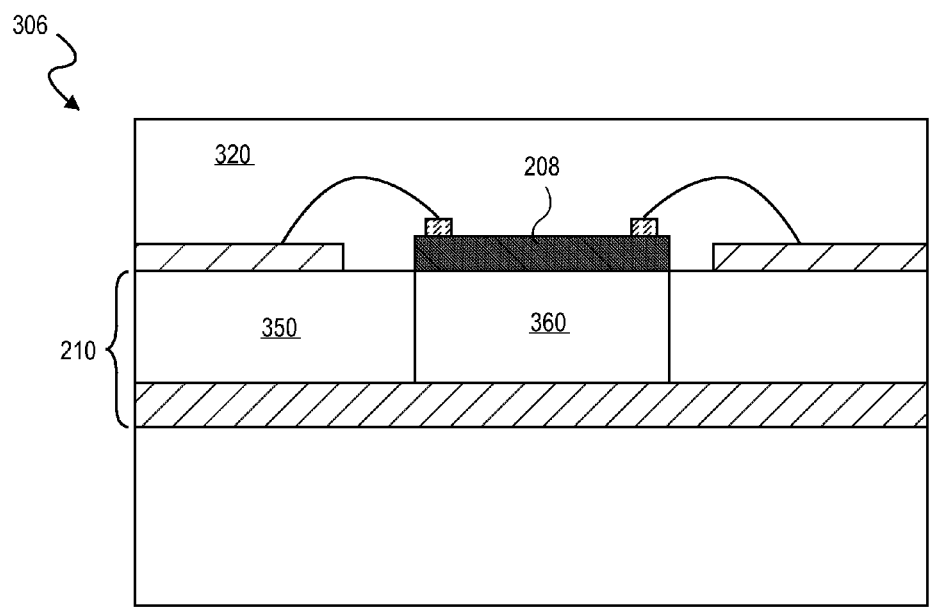

FIG. 3E illustrates one LED display backlighting system 305 in accordance with an embodiment. Generally, the LED display backlighting system 305 entails the package structure 320 (FIG. 3A) disposed on a metal chassis 390. As such, the one LED device 208 shown in FIG. 3E is an atomic unit of the backlighting system 350. As shown in FIG. 3E, an interposer TSuV 355 includes via metal 360 extending through the interposer 350 to be in direct contact with the metal chassis 390. In the exemplary embodiments where the via metal 360 has a low CTE but high thermal conductivity (e.g., comprising molybdenum or tungsten alloys such as NiW, NiMo, CoW, or CoMo), heat from the LED device 208 can be efficiently removed vertically to the metal chassis because the interposer TSuV 355 has a longitudinal axis aligned with the LED device 208 and the transparent dielectric material 205 is relatively thin. Thermal cross-talk between adjacent LED devices within the backlighting system 305 are reduced or minimized by low thermal conductivities of the interposer 350 (glass, ceramic, etc.) and dielectric material 205. In further embodiments, the via metal 360 may also extend through the metal film 209 and/or the dielectric material 205 to make direct contact with the LED device 208, as is shown in FIG. 3F for the backlighting system 306. Where the dielectric layer 205 and/or the interposer 350 is a large area panel (e.g., non-alkali glass, soda lime glass, parylene, aluminum oxide, or amorphous or polycrystalline silicon, etc.), the backlighting systems 305, 306 may have a very large form factor entailing a large number of LED devices and interposer TSuVs or may be of a very small form factor entailing a small population of LED devices and TSuVs. Although not depicted in FIGS. 3E and 3F, the LED backlighting systems 305, 306 are to have a liquid crystal display panel disposed above the LED package of claim 1 and any such panel in the art may be utilized as embodiments of the present invention are not limited in this respect.

Figure 4A:
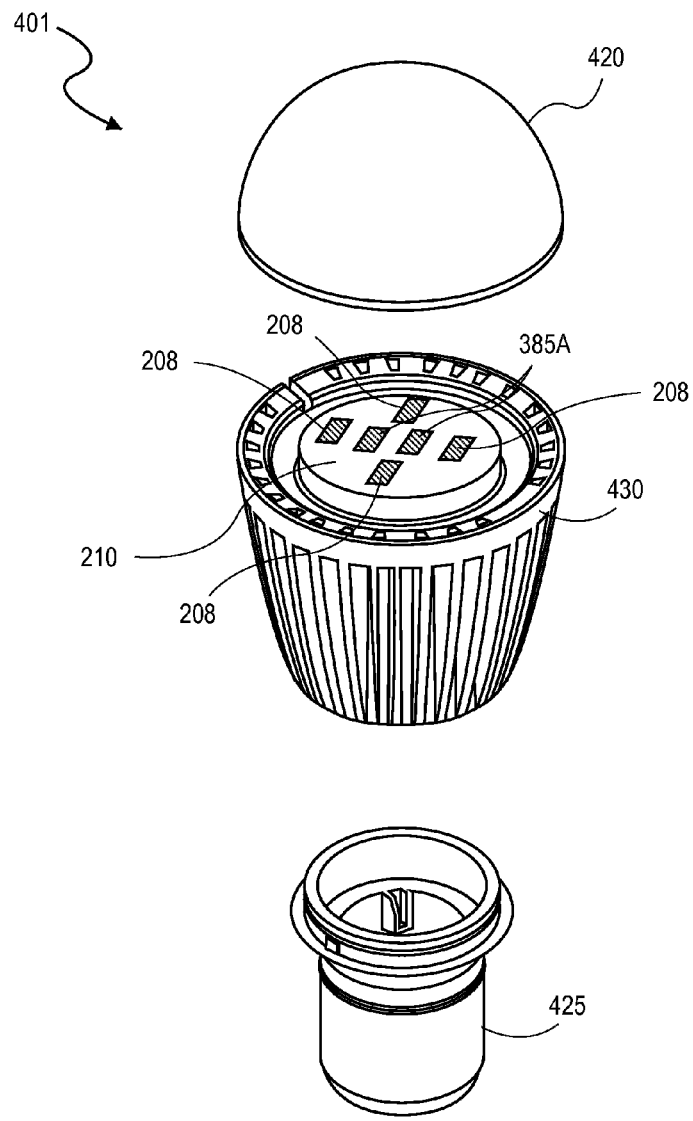
FIG. 4A illustrates an LED bulb, in accordance with an embodiment of the present invention.

FIG. 4A illustrates an exploded isometric view of an LED bulb 401, in accordance with an embodiment of the present invention. As shown, bulb 401 includes a cover 420, a metal chassis 430 and a base 425. Assembled into the chassis 430 is one or more of the LED package structures described herein. For each of the various package structure embodiments describe, the substrate 210 is affixed (e.g., soldered) to the metal 430 to dissipate the heat from LED devices 208 that are thermally coupled through thermal vias in the substrate 210. As further shown, the bulb 401 includes a cluster of LED devices mounted in an array. Each LED device 208 in a cluster may generate light having a white point, or each cluster may generate light having a white point as a population of LED devices. Also disposed on the substrate 210 is one or more ICs 385A that are surface mounted (e.g., as shown in FIG. 3D) or embedded into the substrate 210 (e.g., as shown in FIG. 3B) and having one or more of the functions described elsewhere herein. Any of the passive components described elsewhere herein for the LED packages may also be integrated onto the substrate 210 in any of the manners previously described. In one embodiment, at least a portion of the line-level power conditioning is integrated onto the substrate 210, reducing the cost of the bulb 401. In another embodiment where the IC 385A includes an RF transceiver, the bulb 401 is imparted with an independent remote control interface integrated onto the substrate 210 through which function of one or more of the LED device 208 may be modulated. For example, where the base is a standard Edison-style screw base, the bulb 401 may be retrofitted into an existing light fixture and be independently addressable/controllable via the IC 385A.

Figure 4B:
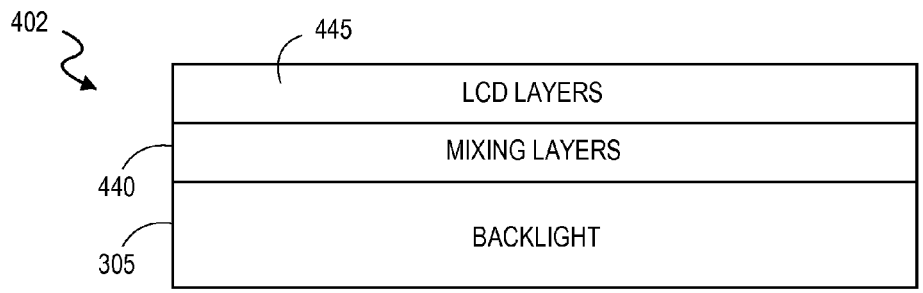
FIG. 4B illustrates a cross-sectional view of an LCD display employing an LED package structure, in accordance with an embodiment of the present invention.
Figure 4C:
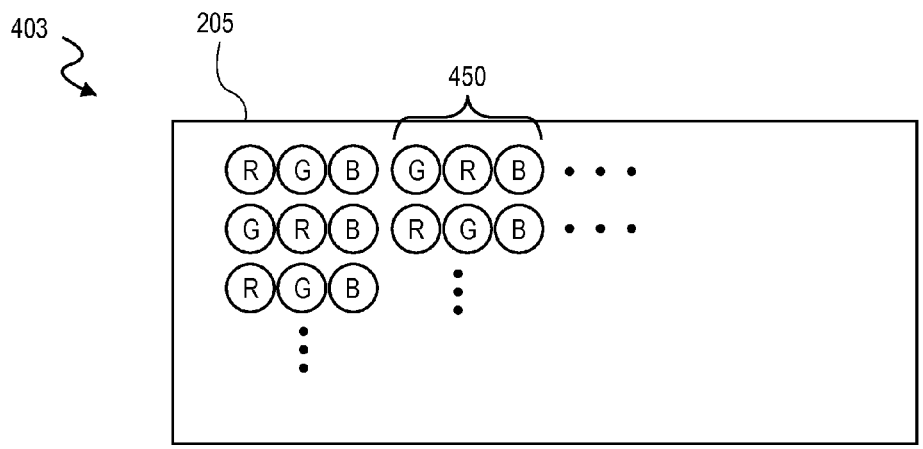
FIG. 4C illustrates a plan-view of an LED display employing an LED package structure, in accordance with an embodiment of the present invention.

FIG. 4B illustrates a cross-sectional view of an LCD display 402 employing the LED backlight system 305 (FIG. 3E), in accordance with an embodiment of the present invention. As shown, the LCD layers 445 are affixed over mixing layers 440, which are in turn affixed over the backlight system 305. FIG. 4C illustrates a plan-view of an LED display 403 employing an LED package structure, in accordance with an embodiment of the present invention. The LED display 403 includes a plurality of LED clusters 450 arrayed over the dielectric material 205. Each of the LED clusters 450 includes at least three LEDs to emit at three different colors (e.g., RBG) which, when combined, have a white point. Depending on which package structure embodiment is employed, the dielectric 205 may further be disposed over the interposer 350 with the metal film 209 disposed there between (i.e. to form a laminate substrate 210) with an interposer TSuV having a longitudinal axis aligned with one of the plurality of LEDs or LED clusters 450. Via fill metal is then in direct contact with the metal chassis and the LED package to thermally couple each LED of the plurality to the metal chassis (e.g., as illustrated in FIG. 3E). For certain such embodiments where the LED package includes an integrated circuit (e.g., IC 375A in FIG. 3B or IC 385A in FIG. 3D), the integrated circuit is an integrated pixel controller circuit surface mounted onto at least one of the dielectric material and interposer. The integrated pixel controller circuit is electrically coupled to the LEDs in the LED clusters. Wih the LED clusters and pixel controller are integrated onto a same substrate (e.g., dielectric material 205), no separate means of support for integrated circuits is needed in the LED display 403 whereas a separate printed circuit board (PCB) is conventional.

Figure 4D:
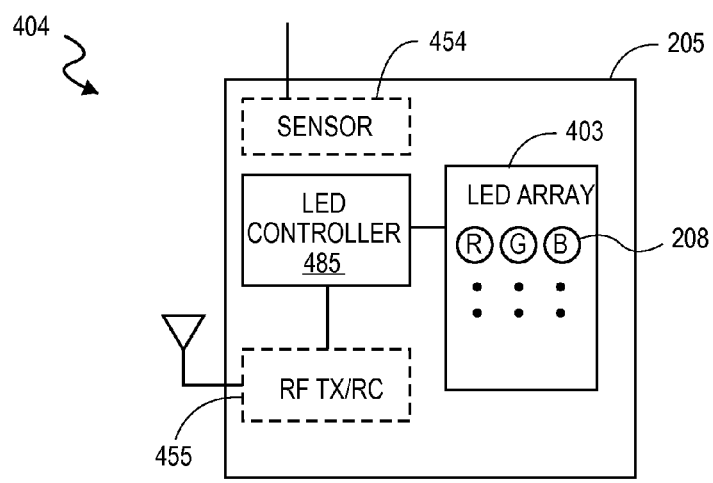
FIG. 4D illustrates an LED system, in accordance with an embodiment of the present invention.

FIG. 4D illustrates a functional block diagram of an LED system 404, in accordance with an embodiment of the present invention. The various functional elements of the LED system 404 are all packaged together on a same substrate or interposer. In the simplest embodiment, LED system 404 includes an LED device and an LED controller 485 disposed on the transparent dielectric material 205. In the exemplary embodiment illustrated, the LED system 404 includes the LED display 403 as previously described in the context of FIG. 4C. The LED display 403 is communicatively coupled to the LED controller 485 which is to control the light output of the display. In further embodiments, at least one of a sensor 454 and RF IC 455 are also packaged with the LED display 403 and LED controller 485. The sensor 454 may employ any known sensor technology, such as but not limited to MEMs sensors, thermal diodes, or photodetector (p-i-n) devices, etc. operable to sense an environmental conditions external to the packaged LED system 404, such as, but not limited to ambient light level, or ambient temperature. If present, the sensor 454 has an output pad coupled to an input pad of the LED controller 485. Power to the sensor 454, if needed may also be supplied by the LED controller 485. The RF IC 455 may implement any known wireless transceiver technology, such as, but not limited to the Zigbee® protocol stack (e.g., 2.4-GHz IEEE 802.14.4, 2.4-GHz IEEE 802.15.4) which may further implement the Zigbee Smart Energy Profile Specification 0x0109 to implement a uniquely addressable node corresponding to the packaged LED system 404 and at least accept commands from external of the LED system 404 that are communicated to the LED controller 485 and affect emissions in the LED display 403.

Figure 5A:
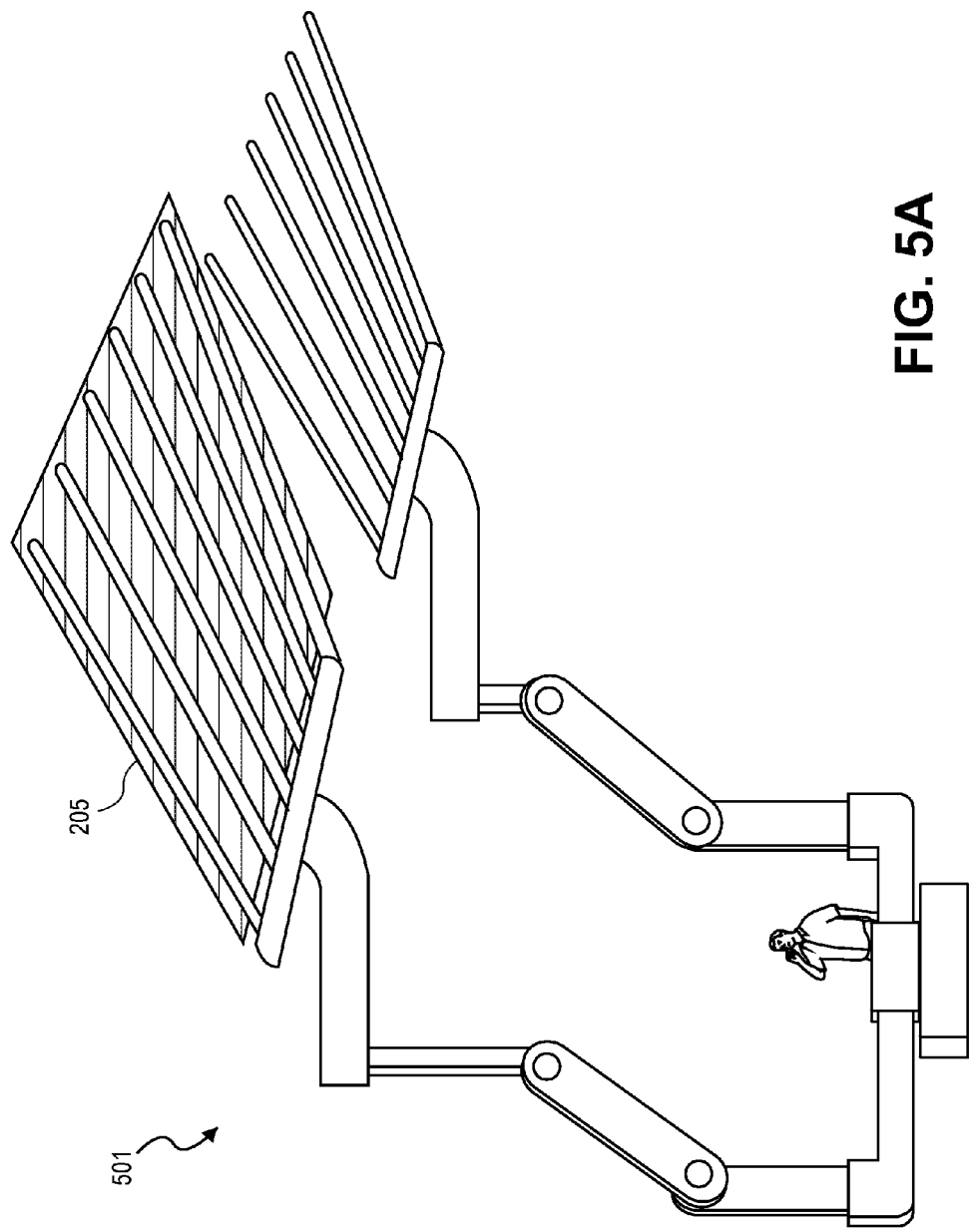
FIGS. 5A and 5B illustrate substrate handling techniques for fabrication of LED package structures, in accordance with embodiments.
Figure 5B:
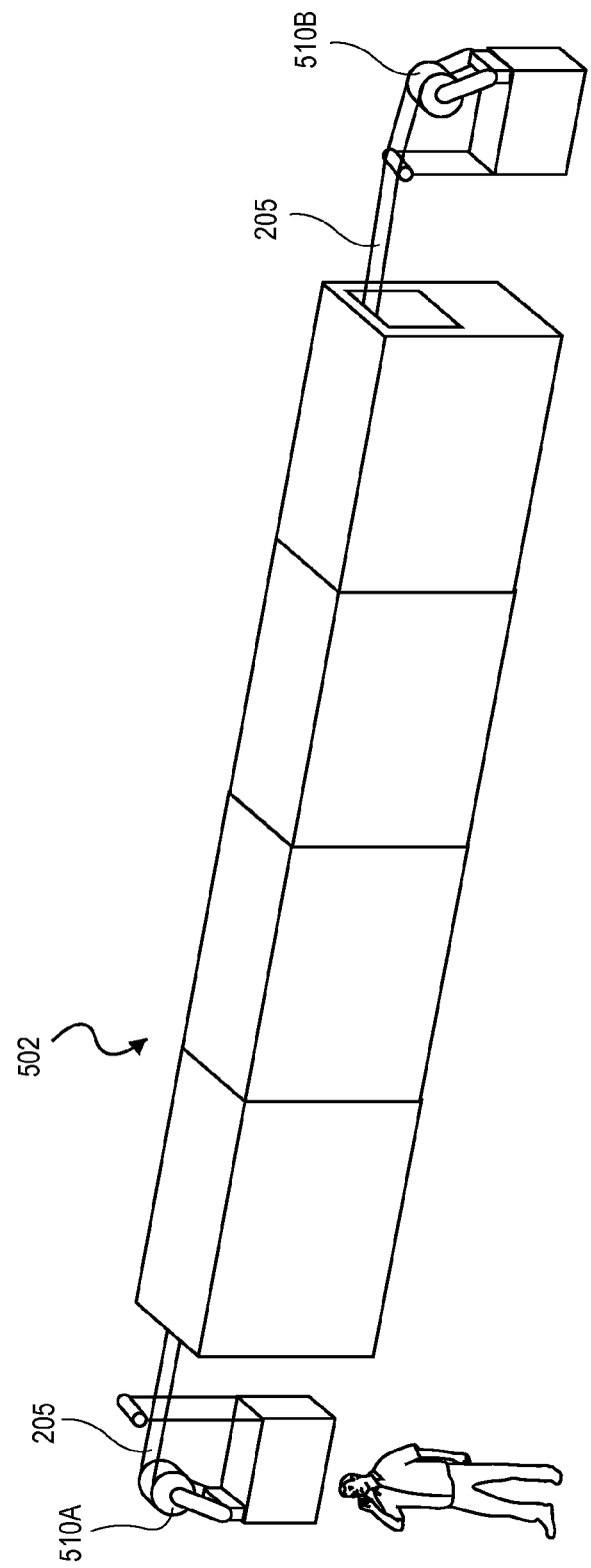

FIGS. 5A and 5B illustrate substrate handling techniques for fabrication of LED package structures, in accordance with embodiments. FIG. 5A illustrates a panel handling robot 501 that may be utilized in one of more of the methods described herein to form one or more of the LED package structures described herein. For example, where a large area panel (e.g., glass) is employed as the dielectric material 205, the panel handling robot 501 may be utilized to transfer the dielectric material 205 through the various plating, LED device bonding, IC chip bonding, and singulation process modules to arrive at the LED package structures described herein. FIG. 5B illustrates a reel-to-reel processing line 502 that that may be utilized in one of more of the methods described herein to form one or more of the LED package structures described herein. For example, where a substrate (e.g., glass) of sufficient flexibility is employed as the dielectric material 205, the reel-to-reel processing line 502 may be utilized to transfer the dielectric material 205 through the various plating, LED device bonding, IC chip bonding, and singulation process modules to arrive at the LED package structures described herein. For example, in one embodiment, a starting dielectric material 205 is disposed on an input roller 510A which is fed into plating and chip bonding stations before being rolled on an output roller 510B. Alternatively, a starting dielectric material 205 is disposed on the input roller 510A which is fed into plating and chip bonding stations before being singulated.

Figure 5C:
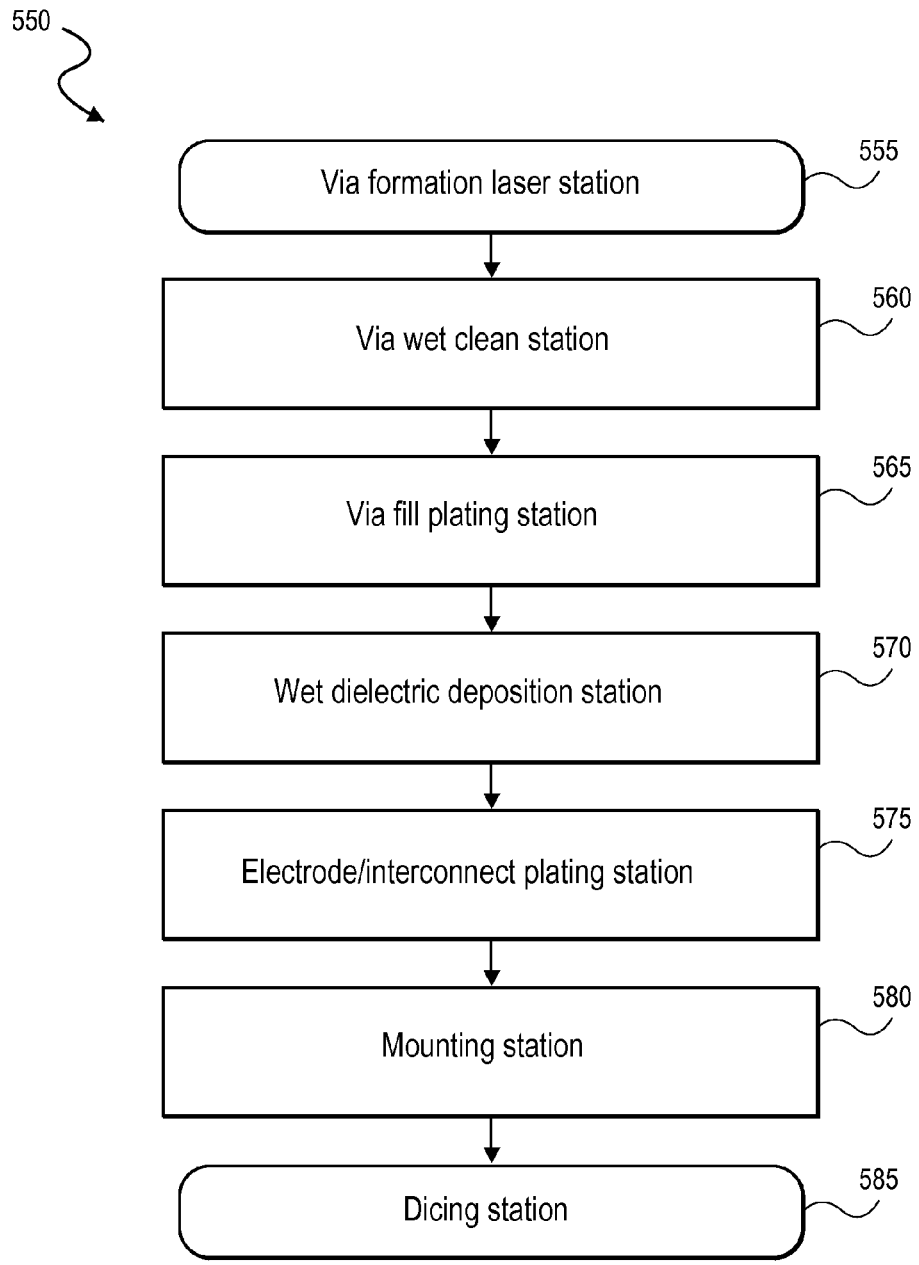
FIG. 5C illustrates a factory line for fabrication of LED package structures, in accordance with embodiments.

FIG. 5C illustrates a factory line 550 for fabrication of LED package structures, in accordance with embodiments. The factory line flow 550 is an exemplary series of processing modules or stations through which a substrate (e.g., transparent dielectric material 205 or interposer 350) may be sequentially processed (though not necessarily in the order depicted). Depending on the embodiment, one or more reel-to-reel processing line 502 may implement one or more of each of the processing modules depicted in FIG. 5C to assemble any of the LED package structures described herein.

The factory line 550 includes a via formation station 555 in which blind or through vias are formed into either the dielectric material 205 or interposer 350. The via formation station 555 may entail a plasma etching system, or preferably a laser which may either directly ablate material to form the vias, or more preferably for embodiments where the vias are formed in a glass, the laser modifies the glass to from columnar regions which may be selectively wet etched to form anisotropic vias. The factory line 550 further includes a via wet clean station 560 for cleaning/etching of the vias subsequent to exposing the substrate/interposer to plasma or laser via formation. In further embodiments, the via formation station is adapted for photoselective plating, described further elsewhere herein, in which a laser is to implement a selective patterning of a photosensitive catalytic material.

The factory line 550 includes a via fill plating station 565. In the exemplary embodiment, the via fill plating station 565 includes an activation station where a catalytic material may be selectively activated in first portions of the substrate/interposer (e.g., within a via) relative to second portions where no catalytic material is to be (e.g., on a surface of the dielectric material 205 where no metal pad/interconnect 215 or metal film 209 is to be formed). In further embodiments, the via fill plating station 565 includes a catalytic material removal station where catalytic material may be selectively removed in second portions where no catalytic material to be (e.g., on a surface of the dielectric material 205 where no metal pad/interconnect 215 or metal film 209 is to be formed) relative to first portions of the substrate/interposer (e.g., within a via) where catalytic material is to remain. In further embodiment, the via fill plating station 565 includes an electroless or electrolytic plating bath in which one of the via fill metals 240 or 360 is formed.

In the exemplary embodiment, the factory line 550 includes a wet dielectric deposition station 570. The wet dielectric deposition station 570 may be any station known in the art for spray or immersion application of one or more of dielectric materials described herein, such as, but not limited to silicon dioxide, parylenes, or alumina oxide (e.g., forming the dielectric material 205, transparent cap 230, etc.). An electrode/interconnect plating station 575 is employed in the factor line 550 where the plating of metal pads/interconnects 215, etc. is not concurrent with the via fill. The plating station 575 may similarly include an activation station where an activation layer comprising catalytic material is deposited. The plating station 575 may include a laser station where regions of the activation layer are exposed to selectively activate or deactivate catalytic material in the activation layer. The plating station may further include an electroless plating bath or electrolytic plating bath to deposit any of the metal compositions described elsewhere herein for the metal pads/interconnects 215. The plating station 575 may further include a selective bump plating station, for example where an LED device or LED device controller IC is to be flip-chip bonded to the dielectric 205.

The factory line 550 concludes with a dicing station 585 where large area substrate are singulated into individual LED package structures. Any of laser-based, mechanical saw, or anisotropic etch (DRIE)-based scribing may be performed with mechanical sawing and laser-based techniques being preferable for the large area substrate embodiments (e.g., panels or reel-fed).

The factory line 550 includes a mounting station 580 where at least the LED device 208 is surface mounted to the transparent dielectric 205. The mounting station 580 may be any conventional pick and place chip mounting station, reel-to-reel or otherwise, operable to wire bond or flip-chip bond the LED device 208 to the metal pads/interconnects 215.

Figure 6:
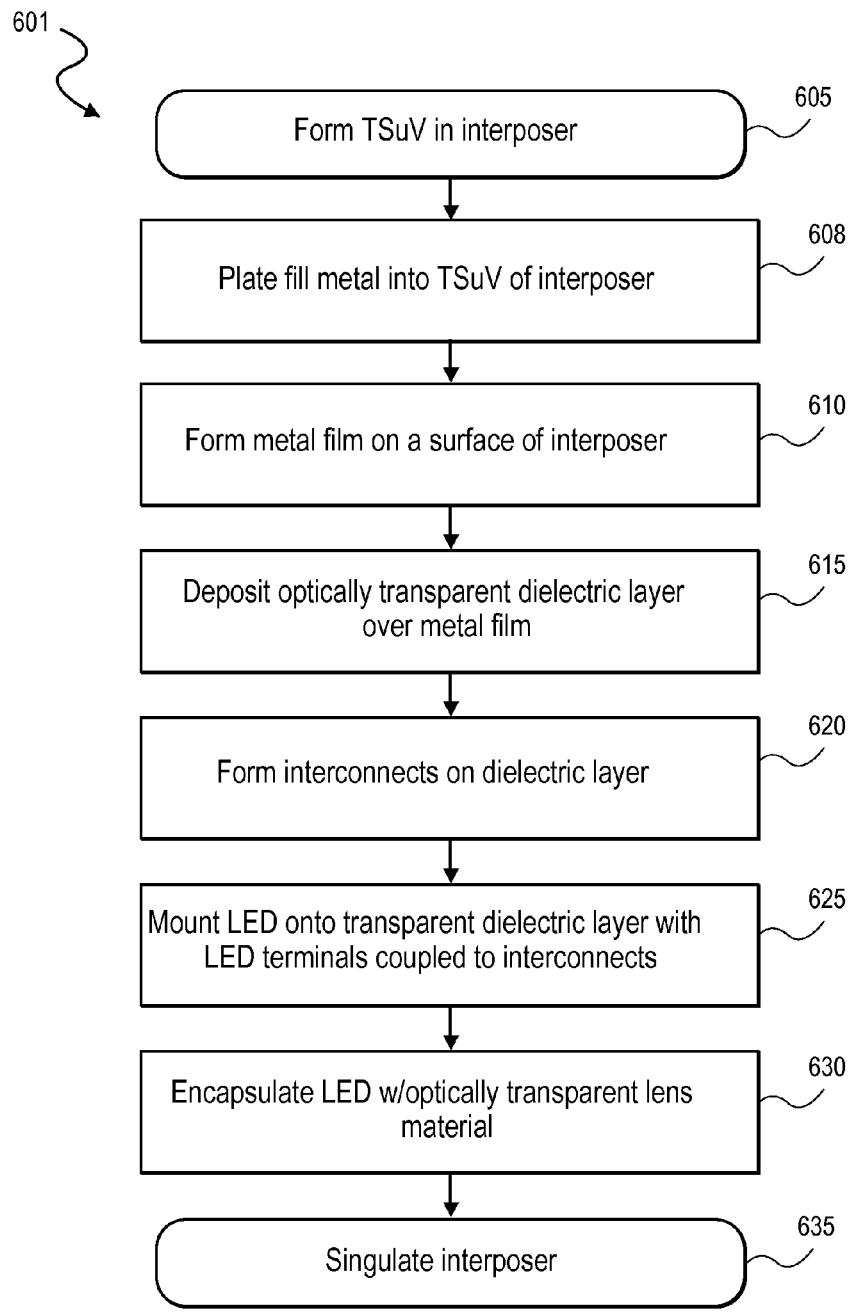
FIG. 6 illustrates a method for fabrication of LED package structures, in accordance with embodiments.

FIG. 6 illustrates a method 601 for fabrication of LED package structures, in accordance with embodiments. The methods described in the context of FIG. 6 may be implemented by the factory line 550.

In one embodiment where the LED package structure 301 is formed, the method 601 begins with receiving the interposer 350. In embodiments where the LED package structures 302, 303 or 304 are formed, the interposer 350 is received with the integrated circuit 375A and/or passive device 375B mounted. An interposer TSuV is then formed at operation 605, for example with deep reactive ion (DRIE) etching, laser ablation, laser assisted removal (i.e., columnar conversion), laser jet drilling, water jet drilling, etc.

At operation 608, the fill metal 360 is plated into the interposer TSuV. Prior to plating the fill metal 360, one or more of a dielectric liner, diffusion barrier (metal such as Ti, Ta, TiW, TiN, TaN, or dielectric such as $Si_3N_4$, etc.) may be deposited depending on the material employed for the interposer 350. In certain embodiments the fill metal 360 and the metal film 209 is plated concurrently at operation 608. In other embodiments where the metal film 209 is deposited prior to forming the TSuV at operation 605, the TSuV formed at operation 605 is a blind via, and the fill metal 360 is formed by plating metal seeded from the metal film 209. Plating of the fill metal 360 may be selective, in which case filling of the TSuV 355 does not result in blanket plating of at least one of the front side or back side surfaces of the interposer 350, or non-selective where metal is also plated on at least one of the front side (e.g., to form the metal film 208 or back side metal 380). In further embodiments, where an integrated heat sink is to be formed from the back side metal 380, photoselective plating may be utilized to pattern the back side metal 380. Applicable photoselective plating techniques are described further below in the context of selective via filling and selective formation of metal pads 215.

In certain selective via fill embodiments, a catalytic material is to selectively activate via surfaces only. In one such embodiment, catalytic material is deposited over a sidewall of the through TSuV 355, and over front or back side of the interposer 350. This may be done by exposing a via to a chemical activation solution (e.g. bath exposure, spin coat, spray coat, etc.). The chemical activation solution may be any known in the art for forming surfaces activated with one or more of catalytic materials described elsewhere herein. Where the catalytic material is metal particles, the chemical activation solution has catalytic metal species that are reduced to form metal particles on at least the sidewalls of the TSuV 355. For such an embodiment where the catalytic material includes palladium (Pd) particles, a palladium activation solution includes a source of reducible palladium species, such as, but not limited to palladium chloride. The chemical activation solution may further include hydrochloric acid, acetic acid, and hydrofluoric acid or ammonium fluoride for contact displacement deposition and reducing agents such as, but not limited to borohydride, hypophosphite, dimethylamine borane (DMAB), hydrazine, and formaldehyde for electroless deposition.

In other selective via fill embodiments, a photosensitive film (e.g., titanium oxide ($TiO_2$), tin oxide ($SnO_2$), zinc oxide (ZnO), and lead iodide ($PbI_2$)) is deposited on the interposer 350. For such embodiments, the photosensitive film further includes catalytic particles either on a top surface of the film or embedded throughout a thickness of the photosensitive film. In such embodiments, operation 608 entails, at least in part, exposing the TSuV 355 to a chemical solution containing a photosensitive species. For example an amorphous $TiO_2$ layer including palladium may be formed by spin-coating on to a workpiece a solution containing a source of titanium ions and a solution containing a source of palladium ions. During a REDOX reaction, the oxidation state of the titanium ion may increase while the oxidation state of the palladium is reduced with the ion becoming a metal particle. Upon drying, a dried layer including the catalytic material within the photosensitive film is formed.

In other selective via fill embodiments, the operation 608 includes forming a polymer film with the catalytic material disposed on the surface and/or embedded through a thickness of the polymer film. For example, the TSuV 355 may be exposed to a chemical solution containing a polymerizing agent which, upon drying, forms a dried layer including the catalytic material, a polymerizing species, and may also include a photosensitive species. In one such embodiment where the catalytic material is SAM-$NH_2Pd$, a reduction of palladium ions in a polymerizing solution is achieved with a reducing agent, such as, but not limited to dimethylaminoborane (DMAB) or hypophoshite.

In still another selective via fill embodiment, the operation 608 entails depositing a seed metal over the via sidewalls (and any barrier metal and/or dielectric liner present on the sidewall) and depositing a photoresist over the seed metal. Generally, the seed metal may be any known in the art, such as but not limited to, copper (Cu), gold (Au), silver (Ag), nickel (Ni), or cobalt (Co), and wherein the fill metal comprises least one of: copper (Cu), gold (Au), silver (Ag), nickel (Ni), cobalt (Co), tin (Sn), palladium (Pd), tungsten (W), tin-silver alloy (SnAg), tin-silver-copper alloy (SAC), indium-tin alloy (InSn), nickel-palladium-gold alloy (NiPdAu), or lead-tin alloy (SnPb). The photoresist is then patterned to remove the photoresist in all regions except for the via. The seed metal (and barrier if present) is then removed in regions not protected by the photoresist followed by stripping of the photoresist. An alternative to removing the barrier, if present, is oxidizing the barrier through exposure to an oxygen plasma after removing the photoresist and seed layer from regions not protected by the photoresist.

Following any of these catalytic material deposition operations, the catalytic material is removed selectively from over a region of the substrate adjacent to the via. The removal process is selective relative to the via sidewall such that the catalytic material is not removed from the entire longitudinal length of the TSuV 355, but is however removed from substantially all no-via surfaces, such as over the front side and/or back side of the interposer 350. The catalytic material may removed from all surfaces except for a longitudinal via length passing through the interposer 350.

Selective removal of the catalytic material may be performed in a number of fashions so that no activation layer is formed on the flat (e.g., front or back side) of the interposer 350, depending on the catalytic material composition. In embodiments, at least one chemical, mechanical, and photochemical technique is applied. As one example of selective chemical removal, a solvent of the catalytic material may be applied in a manner that prevents wetting of the inner via surface. As one example of selective mechanical removal, an abrading force is applied through a directional jet of solution, flow of solution, etc. in a direction approaching parallel to the front side surface of the interposer 355 so that at least a portion of the inner via surfaces (i.e., sidewalls) are protected. As another example of selective mechanical removal, a pad (e.g., a CMP pad, a wet clean scrubbing, pad, etc.) is placed in direct contact with the catalytic material disposed on the interposer 355 and motion of the pad removes mechanically (i.e., wipes off) the catalytic material from the top side relative to inner via surfaces. Lift off processes during chemical etching of a sacrificial material such as, but not limited to, photoresist, BCB, titanium, and aluminum disposed on the front side surface prior to deposition of the catalytic material can be also used to subsequently remove the catalytic material from the top surface selectively to inner via surfaces. As an example of a photochemical removal, where a via is received with catalytic material incorporated within a photosensitive film, The interposer 355 is exposed to light (e.g., a laser) having an energy (hv) sufficient to remove or deactivate the catalytic material without exposing the entire via sidewall to the light so as to retain a portion of the catalytic material within the via. For example, where palladium ions are present in a photosensitive film containing $SnO_2$, photo oxidation of Sn(II) to Sn(IV) under UV light leads to deactivation of the reducing agent preventing reduction of Pd(II) ions to catalytic Pd particles on the light exposed surface and therefore, the selective deactivation of the catalytic material.

For non-selective via fill embodiments, or following selective activation for selective via fill embodiments, operation 608 entails plating the via fill metal from the activated or seeded surfaces. In the exemplary embodiment, the plating process includes an electroless plating process that deposits a fill metal 360 within the TSuV 355. In general, any electroless deposition process known in the art may be employed for a process time appropriate to fill the via to the desired level. In embodiments where the metal film 209 is formed prior to via fill, an electrolytic via fill is performed with the metal film 209 serving as a plating electrode.

Following via fill, method 601 continues with operation 615 where the optically transparent dielectric material 205 is deposited over the metal film 209. Any conventional deposition process may be utilized at operation 615, depending on the composition of the dielectric material 205. In preferred embodiments, a wet dielectric deposition is performed to deposit any of the materials described elsewhere herein for the dielectric material 205.

At operation 620, the metal pads/interconnects 215 are formed on the dielectric material 205. In embodiments, at least a pair of metal pads are formed by selective plating. The selective plating may generally entail any of the techniques described above for selective activation of the vias 355. However, for operation 620 selectivity is between two adjacent regions of the dielectric material 205 and so the photoselective embodiments previously described are advantageous with laser treatment patterning regions of a photosensitive catalytic material. For example, a photosensitive layer having catalytic particles comprising at least one of: palladium (Pd), platinum (Pt), silver (Ag), gold (Au), nickel (Ni), cobalt (Co), or copper (Cu) may be wet deposited and regions of the photosensitive layer to exposed to light (e.g., from a laser source) having energy sufficient to modulate the activity of the catalytic particles. The metal pads are then electrolessly plated on the patterned regions of active catalytic material.

At operation 625, the LED device(s) 208 are mounted onto the transparent dielectric material 205 with terminals of the LED electrically coupled to the pair of electrodes. As previously described any flip-chip (e.g., C4) process, wire bonding, or like process may be employed. The mounted LED device(s) 208 are then encapsulated with the optically transparent lens material (e.g., cap 230). Wet deposition techniques, for example, may be utilized, followed by a drying and/or curing operation.

The method 601 is then completed with singulating the interposer 350 at operation 635. In embodiments, laser-based modification of the interposer, laser-based ablation of the interposer, or deep reactive ion etching of the interposer is performed at operation 635. Alternatively, singulation can be by mechanical sawing.

Fabrication of the LED package structures 201 through 204 may follow a method similar to the method 601. For example, in one embodiment, the metal for the metal pads/interconnects 215 or metal film 209 is blanket plated onto the transparent dielectric material 205 (e.g., panel or roll of glass, parylene, etc.). A wet deposition (e.g., spray, immersion, etc.) of photosensitive catalytic material is then deposited. Exemplary photosensitive material may again be any of: titanium oxide ($TiO_2$), tin oxide (SnOx), zinc oxide (ZnO), and lead iodide ($PbI_2$). The photosensitive material further includes catalytic particles, such as, but not limited to, palladium (Pd), platinum (Pt), silver (Ag), gold (Au), nickel (Ni), cobalt (Co), or copper (Cu). The photosensitive material is then exposed to light having an energy sufficient to create catalytic species (e.g., for $TiO_2$ a positive image is formed) or to induce chemical dissolution or deactivation of catalytic particles (e.g., for $SnO_2$ a negative image is formed). The pad metal 215 is then selectively plated on the dielectric material 205. With the formation of the cap 230 and singulation occurring as described for the method 601.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A light emitting diode (LED) package, comprising:
    a flexible substrate including:
        a layer of optically transparent dielectric material comprising a first side and a second side opposite the first side; and
        a metal film disposed on the optically transparent dielectric material at the second side;
    an LED affixed to the optically transparent dielectric material at the first side;
    a pair of metal pads disposed on the first side of the optically transparent dielectric material and electrically coupled to terminals of the LED; and an optically transparent cap disposed over the first side of the optically transparent dielectric material encapsulating the LED.

2. The LED package of claim 1, wherein the optically transparent dielectric material comprises a large area panel having a surface area of at least 3500 cm$^2$, wherein the LED is one of a plurality of LEDs arrayed over a first portion of the surface area on a first side of the panel; and wherein the metal film is a continuous film covering a second portion of the surface area on a second side of the panel at least as large as the first portion.

3. The LED package of claim 1, wherein the optically transparent dielectric material comprises a non-alkali glass, soda lime glass, parylene, aluminum oxide having a thickness between 0.1 µm and 1000 µm.

4. The LED package of claim 1, wherein the metal pads comprise at least one of aluminum (Al), silver (Ag), gold (Au), nickel (Ni), copper (Cu), silver-tungsten alloy (AgW), copper-palladium alloy (CuPd), nickel-silver (Ni—Ag), nickel-gold (Ni—Au), nickel-copper (Ni—Cu), copper-silver (Cu—Ag) bi-layer, nickel-copper-tin (Ni—Cu—Sn) or nickel-copper-silver (Ni—Cu—Al) tri-layer.

5. The LED package of claim 1, further comprising:
a through substrate via (TSuV); and
a via metal disposed in the TSuV, wherein the via metal is selected from the group consisting of: copper (Cu), nickel (Ni), cobalt (Co), tungsten (W), molybdenum (Mo), aluminum (Al), and their alloys.

6. The LED package of claim 5, wherein the via metal comprises a nickel-tungsten alloy (NiW), a nickel-molybdenum alloy (NiMo), a cobalt-tungsten (CoW), or cobalt-molybdenum (CoMo).

7. The LED of claim 5, wherein the metal film is selected from the group consisting of: aluminum (Al), aluminum-silicon alloy (AlSi), aluminum-copper alloy (AlCu), aluminum-silicon-copper alloy (AlSiCu), silver (Ag), gold (Au), copper (Cu), chromium (Cr), a copper-silver (Cu—Ag) bi-layer stack, or nickel-copper-silver (Ni—Cu—Ag) tri-layer stack.

8. The LED package of claim 6, wherein the TSuV has a longitudinal axis aligned with a center of the LED.

9. The LED package of claim 1, wherein the LED terminals are flip-chip bonded to the pair of metal pads, or wherein the LED is surface mounted to the optically transparent dielectric material with the terminals wire-bonded to the metal pads, and wherein the cap comprises a plastic lens.

10. The LED package of claim 9, wherein the transparent dielectric comprises at least one cavity with at least one LED or integrated circuit disposed in the cavity.

11. The LED package of claim 1, further comprising:
an interposer in contact with the metal film;
an interposer through substrate via (TSuV); and
a via metal disposed in the interposer TSuV, wherein the via metal is selected from the group consisting of: copper (Cu), nickel (Ni), cobalt (Co), tungsten (W), molybdenum (Mo), aluminum (Al), and their alloys.

12. The LED package of claim 11, wherein the via metal comprises a nickel-tungsten alloy (NiW), or a nickel-molybdenum alloy (NiMo), a cobalt-tungsten alloy (CoW), or cobalt-molybdenum alloy (CoMo).

13. The LED package of claim 11, wherein the interposer comprises non-alkali glass, soda lime glass, parylene, amorphous silicon, polycrystalline silicon, aluminum nitride (AlN), boronitride (BN), aluminum-oxide (Al$_2$O$_3$) having a thickness between 1 µm and 1000 µm.

14. The LED package of claim 13, wherein the interposer TSuV does not extend beyond the metal film, wherein the interposer TSuV has a longitudinal axis aligned with a center of the LED, and wherein no interposer TSuV is disposed below the pair of metal pads.

15. The LED package of claim 14, further comprising an integrated circuit disposed on the interposer, and wherein the LED package further comprises:
a via extending through both the optically transparent dielectric material and the metal film, wherein a via metal disposed in the via is electrically isolated from the metal film and electrically contacting at least one of the pair of metal pads to an output pad of the integrated circuit.

16. The LED package of claim 15, wherein the integrated circuit comprises at least one of a controller or power supply.

17. The LED package of claim 14, further comprising an integrated circuit disposed on the first side of the optically transparent dielectric material, wherein the integrated circuit is surface mounted to the first side with wire bonds to at least one of the electrodes or the integrated circuit is flip-chip bonded to at least one of the pair of electrodes.

18. A light emitting diode (LED) display backlighting system, comprising:
the LED package of claim 1, further comprising a plurality of LEDs arrayed over the optically transparent dielectric material;
a metal chassis;
an interposer disposed between the LED package and the metal chassis;
a plurality of interposer through substrate vias (TSuVs) extending through the interposer, wherein each interposer TSuV has a longitudinal axis aligned with one of the plurality of LEDs; and
a via metal disposed in the interposer TSuVs, the via metal in direct contact with the metal chassis and the LED package to thermally couple each LED of the plurality to the metal chassis.

19. The LED display backlighting system of claim 18, wherein the via metal comprises a nickel-tungsten alloy (NiW), a nickel-molybdenum alloy (NiMo), a cobalt-tungsten alloy (CoW), or cobalt-molybdenum alloy (CoMo).

20. The LED display backlighting system of claim 18, wherein at least one of the dielectric layer and the interposer is a large area panel of non-alkali glass, soda lime glass, parylene, aluminum oxide, or amorphous or polycrystalline silicon, having a surface area of at least 3500 cm$^2$.

21. The LED display backlighting system of claim 18, further comprising a liquid crystal display panel disposed above the LED package.

22. The LED package of claim 1, wherein the optically transparent dielectric material is a portion of a flexible roll of dielectric film for reel to reel processing, wherein the LED is one of a plurality of LEDs arrayed over a first portion of the surface area on a first side of the dielectric film; and wherein the metal film is a continuous film covering a second portion of the surface area on a second side of the dielectric film at least as large as the first portion.

23. A light emitting diode (LED) display, comprising:
the LED package of claim 1, further comprising a plurality of LED clusters arrayed over the optically transparent dielectric material, wherein each LED cluster includes at least three LEDs operable to emit at three different colors which, when combined, have a white point;
an interposer in contact with the metal film;
a plurality of interposer through substrate vias (TSuVs) extending through the interposer, wherein each interposer TSuV has a longitudinal axis aligned with one LED cluster or with one of the at least three LEDs in an LED cluster; and a via metal disposed in the interposer TSuVs.

24. The LED display of claim 23, wherein the via metal comprises a nickel-tungsten alloy (NiW), a nickel-molybdenum alloy (NiMo), a cobalt-tungsten alloy (CoW), or cobalt-molybdenum alloy (CoMo).

25. The LED display of claim 23, wherein at least one of the transparent dielectric layer and the interposer is a large area panel of non-alkali glass, soda lime glass, amorphous or polycrystalline silicon, $Al_2O_3$ or AlN, having a surface area of at least 3500 cm$^2$.

26. The LED display of claim 23, further comprising a pixel controller integrated circuit surface mounted onto at least one of the optically transparent dielectric material and interposer, wherein the pixel controller integrated circuit is electrically coupled to at least one LED in one of the LED clusters.

27. A light emitting diode (LED) bulb, comprising:

the LED package of claim 1, further comprising a plurality of LEDs arrayed over the optically transparent dielectric material, wherein the plurality of LEDs is operable to emit at a white point;

an interposer in contact with the metal film;

a plurality of interposer through substrate vias (TSuVs) extending through the interposer, wherein each of interposer TSuVs has a longitudinal axis aligned with one of the LEDs or aligned with a center of the plurality of LEDs; and a via metal disposed in the interposer TSuV.

28. The light emitting diode (LED) bulb of claim 27, further comprising an LED controller integrated circuit surface mounted or flip-chip connected to the optically transparent dielectric material or interposer, the LED controller integrated circuit electrically coupled to the plurality of LEDs and isolated from the LED by a dielectric material having a thermal conductivity no greater than that of silicon dioxide.

29. The light emitting diode (LED) bulb of claim 27, further comprising a heat sink coupled to the via metal, wherein the heat sink is of the same composition as the via metal.

30. A light emitting diode (LED) system, comprising:

a flexible substrate including:
  a layer of optically transparent dielectric material comprising a first side and a second side opposite the first side; and
  a metal film disposed on the optically transparent dielectric material at the second side;

an LED controller integrated circuit surface mounted or flip-chip connected to the optically transparent dielectric material or an interposer, the LED controller integrated circuit electrically coupled to a plurality of LEDs disposed on the first side of the optically transparent dielectric material; and at least one of an RF and sensor circuit disposed on the optically transparent dielectric material or the interposer and electrically coupled with the LED controller integrated circuit.

* * * * *